United States Patent
Tu et al.

(10) Patent No.: US 9,559,200 B2
(45) Date of Patent: **\*Jan. 31, 2017**

(54) METHOD AND APPARATUS FOR POWER DEVICE WITH MULTIPLE DOPED REGIONS

(71) Applicant: Vanguard International Semiconductor Corporation, Hsinchu (TW)

(72) Inventors: Shang-Hui Tu, Jhubei (TW); Chih-Jen Huang, Yilan County (TW); Jui-Chun Chang, Hsinchu (TW); Shin-Cheng Lin, Tainan (TW); Yu-Hao Ho, Keelung (TW); Wen-Hsin Lin, Jhubei (TW)

(73) Assignee: Vanguard International Semiconductor Corporation, Hsinchu (TW)

( \* ) Notice: Subject to any disclaimer, the term of this patent is extended or adjusted under 35 U.S.C. 154(b) by 0 days.

This patent is subject to a terminal disclaimer.

(21) Appl. No.: 15/052,624

(22) Filed: Feb. 24, 2016

(65) Prior Publication Data
US 2016/0172487 A1    Jun. 16, 2016

Related U.S. Application Data

(62) Division of application No. 14/187,950, filed on Feb. 24, 2014, now Pat. No. 9,306,034.

(51) Int. Cl.
*H01L 29/36* (2006.01)
*H01L 29/78* (2006.01)
(Continued)

(52) U.S. Cl.
CPC ....... *H01L 29/7823* (2013.01); *H01L 29/0615* (2013.01); *H01L 29/0634* (2013.01);
(Continued)

(58) Field of Classification Search
CPC .......... H01L 29/66659; H01L 29/7835; H01L 29/1033; H01L 29/105; H01L 29/0634; H01L 29/0696; H01L 29/1083; H01L 29/1095; H01L 29/66325–29/66348; H01L 29/7393–29/7397
See application file for complete search history.

(56) References Cited

U.S. PATENT DOCUMENTS 4,038,680 A   7/1977  Yagi et al.
4,559,549 A   12/1985 Roberts et al.
(Continued)

*Primary Examiner* — William F Kraig
*Assistant Examiner* — Maliheh Malek
(74) *Attorney, Agent, or Firm* — Finnegan, Henderson, Farabow, Garrett & Dunner, LLP

(57) ABSTRACT

A semiconductor device is provided. The device includes a substrate having a first conductivity type. The device further includes a drain region, a source region, and a well region disposed in the substrate. The well region is disposed between the drain region and the source region and having a second conductivity type opposite to the first conductivity type. The device further includes a plurality of doped regions disposed within the well region. The doped regions are vertically and horizontally offset from each other. Each of the doped regions includes a lower portion having the first conductivity type, and an upper portion stacked on the lower region and having the second conductivity type.

27 Claims, 20 Drawing Sheets

(51) Int. Cl.
*H01L 29/66* (2006.01)
*H01L 29/10* (2006.01)
*H01L 29/06* (2006.01)
*H01L 29/08* (2006.01)
*H01L 21/70* (2006.01)
*H01L 21/265* (2006.01)
*H01L 21/266* (2006.01)
*H01L 29/423* (2006.01)

(52) U.S. Cl.
CPC ........ *H01L 29/0653* (2013.01); *H01L 29/086* (2013.01); *H01L 29/0847* (2013.01); *H01L 29/0865* (2013.01); *H01L 29/0878* (2013.01); *H01L 29/0882* (2013.01); *H01L 29/105* (2013.01); *H01L 29/1095* (2013.01); *H01L 29/66659* (2013.01); *H01L 29/66681* (2013.01); *H01L 29/66712* (2013.01); *H01L 29/7802* (2013.01); *H01L 29/7816* (2013.01); *H01L 29/7835* (2013.01); *H01L 21/266* (2013.01); *H01L 21/2652* (2013.01); *H01L 29/1045* (2013.01); *H01L 29/42368* (2013.01)

(56) References Cited

U.S. PATENT DOCUMENTS

| | | | |
|---|---|---|---|
| 4,704,786 A | 11/1987 | Kub | |
| 5,070,382 A | 12/1991 | Cambou | |
| 5,525,826 A | 6/1996 | Palara | |
| 5,574,301 A * | 11/1996 | Blanchard | H01L 27/0605 257/329 |
| 5,716,887 A | 2/1998 | Kim | |
| 5,801,420 A | 9/1998 | Fujishima | |
| 6,168,983 B1 * | 1/2001 | Rumennik | H01L 21/266 257/338 |
| 6,194,737 B1 | 2/2001 | Ohshima | |
| 6,207,994 B1 * | 3/2001 | Rumennik | H01L 21/26 257/339 |
| 6,365,447 B1 | 4/2002 | Hèbert et al. | |
| 6,424,007 B1 | 7/2002 | Disney | |
| 6,468,847 B1 * | 10/2002 | Disney | H01L 29/7825 257/E21.088 |
| 6,479,876 B1 | 11/2002 | Deboy et al. | |
| 6,509,220 B2 | 1/2003 | Disney | |
| 6,570,219 B1 * | 5/2003 | Rumennik | H01L 21/26 257/262 |
| 6,589,336 B1 | 7/2003 | Ebara et al. | |
| 6,590,273 B2 | 7/2003 | Okawa et al. | |
| 6,639,272 B2 | 10/2003 | Ahlers et al. | |
| 6,639,277 B2 | 10/2003 | Rumennik et al. | |
| 6,642,558 B1 | 11/2003 | Letavic et al. | |
| 6,677,643 B2 | 1/2004 | Iwamoto et al. | |
| 6,803,629 B2 | 10/2004 | Tihanyi | |
| 6,803,829 B2 * | 10/2004 | Duncan | H01F 17/0006 257/E27.046 |
| 6,839,272 B2 * | 1/2005 | Ooishi | G11C 11/16 326/39 |
| 6,844,592 B2 | 1/2005 | Yamaguchi et al. | |
| 6,927,103 B2 | 8/2005 | Letavic et al. | |
| 6,982,459 B2 | 1/2006 | Suzuki et al. | |
| 7,008,865 B2 | 3/2006 | Uno | |
| 7,101,997 B2 * | 9/2006 | Wassmann-Wilken | C07D 279/28 544/35 |
| 7,180,105 B2 | 2/2007 | Potts | |
| 7,541,260 B2 | 6/2009 | Pfirsch et al. | |
| 7,838,927 B2 * | 11/2010 | Saggio | H01L 29/0634 257/330 |
| 7,986,004 B2 | 7/2011 | Ohdaira et al. | |
| 8,013,360 B2 | 9/2011 | Saito et al. | |
| 8,101,997 B2 | 1/2012 | Willmeroth et al. | |
| 8,154,078 B2 | 4/2012 | Chang et al. | |
| 8,252,652 B2 | 8/2012 | Chang et al. | |
| 8,264,015 B2 | 9/2012 | Eklund | |
| 8,704,300 B1 | 4/2014 | Lin et al. | |
| 8,723,256 B1 | 5/2014 | Lin et al. | |
| 8,785,306 B2 * | 7/2014 | Guan | H01L 29/0634 257/330 |
| 8,921,202 B2 | 12/2014 | Lin et al. | |
| 9,054,129 B1 | 6/2015 | Tu et al. | |
| 9,076,862 B2 | 7/2015 | Sulistyanto et al. | |
| 9,129,989 B1 | 9/2015 | Tu et al. | |
| 2002/0050613 A1 | 5/2002 | Rumennik et al. | |
| 2002/0119611 A1 * | 8/2002 | Disney | H01L 29/7825 438/197 |
| 2002/0130361 A1 | 9/2002 | Imam et al. | |
| 2002/0132405 A1 | 9/2002 | Disney | |
| 2002/0137292 A1 | 9/2002 | Hossain et al. | |
| 2003/0155610 A1 | 8/2003 | Schlogi et al. | |
| 2003/0193067 A1 | 10/2003 | Kim et al. | |
| 2003/0218188 A1 | 11/2003 | Jeon et al. | |
| 2005/0045922 A1 | 3/2005 | Ahlers et al. | |
| 2005/0156235 A1 | 7/2005 | Fujihira | |
| 2006/0076612 A1 | 4/2006 | Otake et al. | |
| 2007/0001194 A1 | 1/2007 | Ono et al. | |
| 2007/0176229 A1 | 8/2007 | Willmeroth et al. | |
| 2008/0173949 A1 | 7/2008 | Ma et al. | |
| 2008/0265315 A1 | 10/2008 | Mauder et al. | |
| 2009/0057717 A1 | 3/2009 | Rodrigues | |
| 2009/0114957 A1 | 5/2009 | Hwang | |
| 2009/0236697 A1 | 9/2009 | Ono et al. | |
| 2010/0025756 A1 | 2/2010 | Fu et al. | |
| 2010/0078775 A1 | 4/2010 | Mauder et al. | |
| 2010/0148253 A1 | 6/2010 | Tu et al. | |
| 2010/0148255 A1 | 6/2010 | Fuernhammer et al. | |
| 2010/0187566 A1 | 7/2010 | Jou et al. | |
| 2010/0327330 A1 | 12/2010 | Eklund | |
| 2012/0018856 A1 | 1/2012 | Weyers et al. | |
| 2012/0064684 A1 | 3/2012 | Hsieh | |
| 2012/0273875 A1 | 11/2012 | Yedinak et al. | |
| 2013/0072004 A1 | 3/2013 | Tsuchiko | |
| 2013/0126967 A1 | 5/2013 | Toyoda et al. | |
| 2013/0175608 A1 | 7/2013 | Lee et al. | |
| 2014/0035102 A1 * | 2/2014 | Korec | H01L 27/082 257/566 |
| 2014/0124774 A1 | 5/2014 | Liu et al. | |
| 2015/0137229 A1 | 5/2015 | Sulsistyanto et al. | |
| 2015/0243780 A1 | 8/2015 | Lin et al. | |
| 2015/0243783 A1 | 8/2015 | Lee et al. | |
| 2015/0270131 A1 | 9/2015 | Sieieniec et al. | |
| 2015/0295026 A1 | 10/2015 | Chang et al. | |

* cited by examiner

METHOD AND APPARATUS FOR POWER DEVICE WITH MULTIPLE DOPED REGIONS

This is a divisional of application Ser. No. 14/187,950, filed Feb. 24, 2014, which is incorporated herein by reference.

FIELD

Example embodiments relate to a semiconductor device, and in particular, to a semiconductor device for a power device with multiple doped regions and a method for manufacturing the same.

BACKGROUND

Power semiconductor devices for high-voltage applications often use vertical double-diffused metal-oxide-semiconductor field effect transistors (VDMOSFETs) or laterally diffused metal-oxide-semiconductor field effect transistors (LDMOSFETs). In order to increase the breakdown voltage of high-voltage semiconductor devices, several methods are commonly in use, for example: the doping concentration of a deep well region (or known as drift region in the art) is reduced, the depth of the drift region is increased, or the length of an isolation structure (or known as field oxide layer in the art) underlying a gate is increased.

However, when the breakdown voltage of a power semiconductor device is increased by the above-described ways, the resistance in the ON state (ON-resistance) or the size of the transistor is increased as well, which undesirably reduces the performance of the device or increases the device area of a semiconductor device.

Thus, there exists a need in the art for development of a semiconductor device, capable of increasing the breakdown voltage while preventing the ON-resistance or device size from increasing.

SUMMARY OF EMBODIMENTS

Consistent with this disclosure, a semiconductor device is provided. The device includes a substrate having a first conductivity type. The device further includes a drain region, a source region, and a well region disposed in the substrate. The well region is disposed between the drain region and the source region and having a second conductivity type opposite to the first conductivity type. The device further includes a plurality of doped regions disposed in the well region. The doped regions are vertically and horizontally offset from each other. Each of the doped regions includes a lower portion having the first conductivity type, and an upper portion stacked on the lower region and having the second conductivity type.

Consistent with the disclosure, a semiconductor device is provided. The device includes a substrate having a first conductivity type, and an epitaxial structure having the first conductivity type disposed on the substrate. The device further includes a drain region and a source region disposed in the epitaxial structure, and a well region interposed between the drain region and the source region. The well region is disposed in both the substrate and the epitaxial structure, and has a second conductivity type opposite to the first conductivity type. The device further includes a first doped region disposed in the well region of the substrate, and a second doped region disposed in the well region of the epitaxial structure. The first doped region and the second doped region are vertically and horizontally offset from each other. Each of the doped regions includes a lower portion having the first conductivity type, and an upper portion stacked on the lower region and having the second conductivity type.

Consistent with the disclosure, a semiconductor device is provided. The device includes a substrate having a first conductivity type, and a plurality of epitaxial layers having the first conductivity type and disposed on the substrate. The device further includes a drain region and a source region disposed in the uppermost epitaxial layer, and a well region interposed between the drain region and the source region. The well region is disposed in the substrate and the epitaxial layers, and has a second conductivity type opposite to the first conductivity type. The Device further includes a plurality of doped regions disposed in the epitaxial layers. At least two of the doped regions being vertically and horizontally offset from each other. Each of the doped regions includes a lower portion having the first conductivity type, and an upper portion stacked on the lower region and having the second conductivity type.

Consistent with the disclosure, a method of manufacturing a semiconductor device is provided. The method includes preparing a substrate of a first conductivity type, and forming a well region in a substrate. The well region has a second conductivity type opposite to the first conductivity type. The method further includes forming a mask layer over the substrate. The mask layer includes a plurality of holes having different depths from an upper surface of the mask layer. The method further includes implanting a first implant, through the mask layer, into the well region to form a plurality of first doped portions. At least two of the first doped portions are vertically and horizontally offset from each other. The first doped portions have the first conductivity type. The method further includes implanting a second implant, through the mask layer, into the well region to form a plurality of second doped portions. At least two of the second doped portions are vertically and horizontally offset from each other. The second doped portions are stacked on the first doped portions and have the second conductivity type.

Consistent with the disclosure, a method of manufacturing a semiconductor device is provided. The method includes preparing a substrate of a first conductivity type and forming a well region in the substrate. The well region has a second conductivity type opposite to the first conductivity type. The method further includes forming a first mask layer over the substrate. The first mask layer including a first hole. The method further includes implanting a first implant and a second implant, through the first mask layer, into the well region to form a first doped region. The first doped region includes a lower portion having the first conductivity type, and an upper portion stacked on the lower region and having the second conductivity type. The method further includes removing the first mask layer from the substrate, and forming a second mask layer over the substrate. The second mask layer includes a second hole. The method further includes implanting the first implant and the second dopant, through the second mask layer, into the well region to form a second doped region such that the first doped region and the second doped region are vertically and horizontally offset from each other. The second doped region includes a lower portion having the first conductivity type, and an upper portion stacked on the lower region and having the second conductivity type. The method further includes removing the second mask layer from the substrate.

Consistent with the disclosure, a method of manufacturing a semiconductor device is provided. The method includes preparing a substrate of a first conductivity type, and forming a first well region in a substrate. The first well region has a second conductivity type opposite to the first conductivity type. The method further includes forming a first epitaxial layer of the first conductivity type on the substrate, and forming a second well region in the first epitaxial layer. The second well region has the second conductivity type. The method further includes forming a first mask layer over the first epitaxial layer. The first mask layer including a first hole. The method includes implanting a first implant and a second implant, through the first mask layer, into the second well region to form a first doped region. The first doped region includes a lower portion having the first conductivity type, and an upper portion stacked on the lower region and having the second conductivity type. The method further includes removing the first mask layer from the first epitaxial layer, forming a second epitaxial layer of the first conductivity type on the first epitaxial layer, and forming a third well region in the second epitaxial layer. The third well region has the second conductivity type. The first, second and third well regions form a continuous well region. The method further includes forming a second mask layer over the second epitaxial layer. The second mask layer includes a second hole. The method includes implanting the first implant and the second dopant, through the second mask layer, into the third well region to form a second doped region such that the first doped region and the second doped region are vertically and horizontally offset from each other. The second doped region includes a lower portion having the first conductivity type, and an upper portion stacked on the lower region and having the second conductivity type. The method further includes removing the second mask layer from the second epitaxial layer.

BRIEF DESCRIPTION OF THE DRAWINGS

Reference will now be made, by way of example, to the accompanying drawings which show example embodiments of the present application, and in which.

DESCRIPTION OF EXAMPLE EMBODIMENTS

Figure 1A:
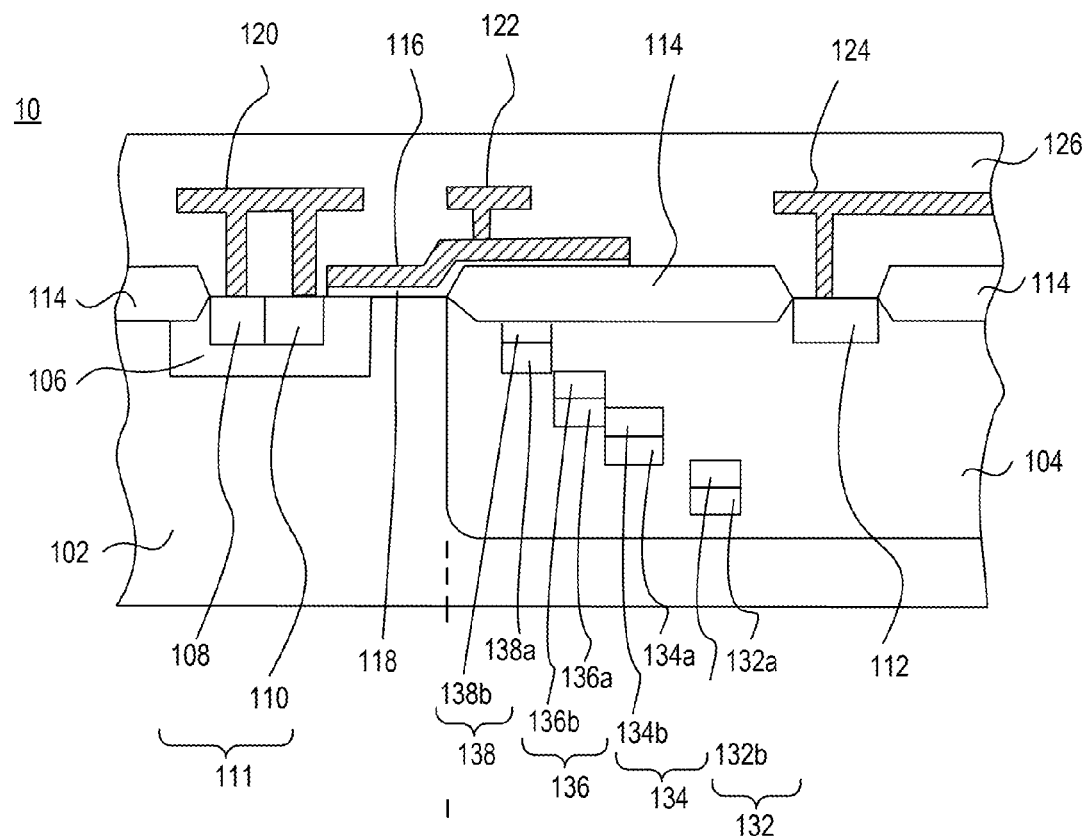
FIGS. 1a-1b show an example power semiconductor device consistent with some embodiments of this disclosure.

Detailed example embodiments are described below and illustrated in the accompanying drawings.

Reference is now made to FIG. 1, which shows an example power semiconductor device 10. Device 10 is an n-type device and includes a p-type semiconductor substrate 102. A gate structure 116 and a field insulating layer 114 are on substrate 102. A gate insulating layer 118 is disposed between gate structure 116 and substrate 102. A portion of gate insulating layer 118 extends to cover a portion of field insulating layer 114. Moreover, a p-type body region 106 and an n-type well region 104 are respectively disposed in substrate 102 on both sides of gate structure 116. A p-type contact region 108 and an adjacent n-type contact region 110 collectively as a source region 111 are disposed in body region 106, and an n-type contact region as a drain region 112 is disposed in well region 104.

Moreover, a plurality of doped regions 132, 134, 136, 138 are disposed in well region 104 between source region 111 and drain region 112. Doped region 132 includes a p-type lower portion 132a and an n-type upper portion 132b stacked on top of lower portion 132a. Similarly, doped regions 134, 136, 138 include p-type lower portions 134a, 136a, 138a, and n-type upper portions 134b, 136b, 138b, respectively. It can be appreciated that although four doped regions are shown in FIG. 1, the number of the doped regions may be more or less than four according to some embodiments.

Doped regions 132, 134, 136, 138 are arranged in well region 104 such that they are at least vertically and horizontally offset from each other. For example, doped region 132 is vertically and horizontally separated from doped region 134. Moreover, although doped region 134 is vertically and horizontally offset from doped region 136, n-type upper portion 134b is in contact with p-type lower portion 136a. Further, depths of doped regions 132, 134, 136, 138 as measured from the surface of substrate 102 (the interface between substrate 102 and of field insulating layer 114 as shown in FIG. 1a) are set in an ascending order in a direction from source region 111 to drain region 112.

Figure 1B:
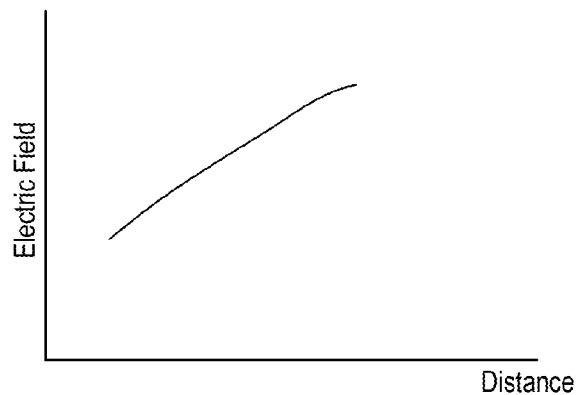

In some embodiments, the depths of doped regions 132, 134, 136, 138 may be determined by an electric field distribution profile of well region 104. FIG. 1b shows an electric field distribution profile of well region 104 of FIG. 1a before doped regions 132, 134, 136, 138 are disposed in well region 104. Based on the profile, doped region 132 is arranged deeper in well region 104 where the electric field is stronger, while doped region 138 is arranged adjacent to the surface where the electric field is weaker.

Moreover, a conductive source electrode 120 is electrically connected to p-type contact region 108 and n-type contact region 110. A conductive drain electrode 124 is electrically connected to n-type contact region 112. A conductive gate electrode 122 is electrically connected to gate structure 116. An interlayer dielectric layer 126 is disposed to cover electrodes 120, 122, 124.

Figure 2A:
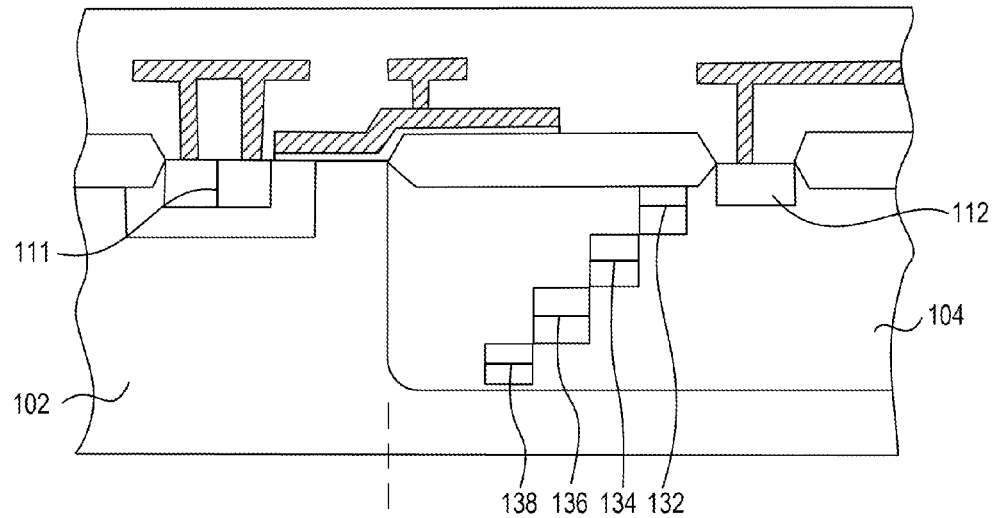
FIGS. 2a-2b show an example power semiconductor device consistent with some embodiments of this disclosure.
Figure 2B:
Figure 3A:
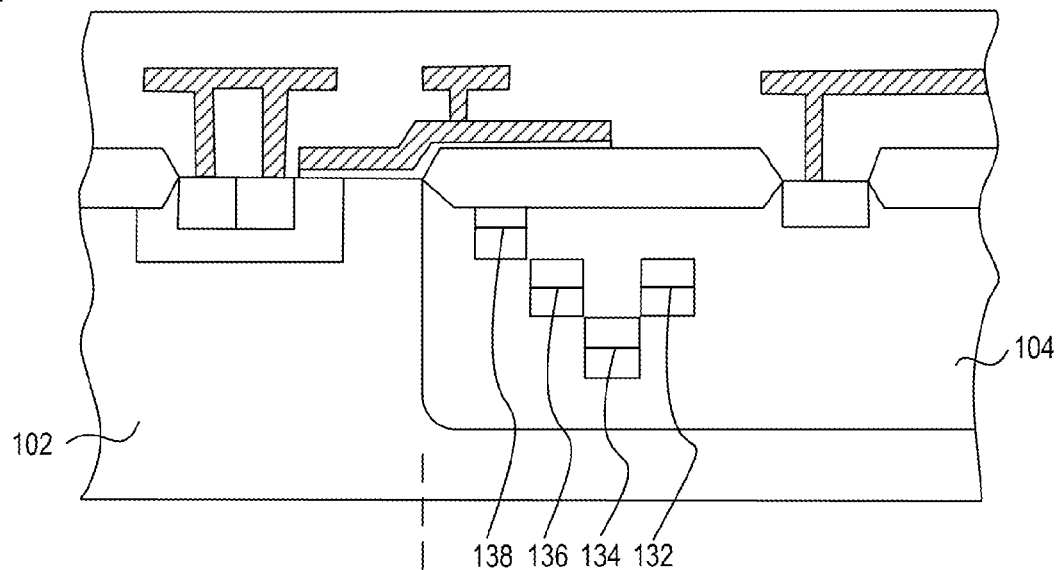
FIGS. 3a-3b show an example power semiconductor device consistent with some embodiments of this disclosure.
Figure 3B:
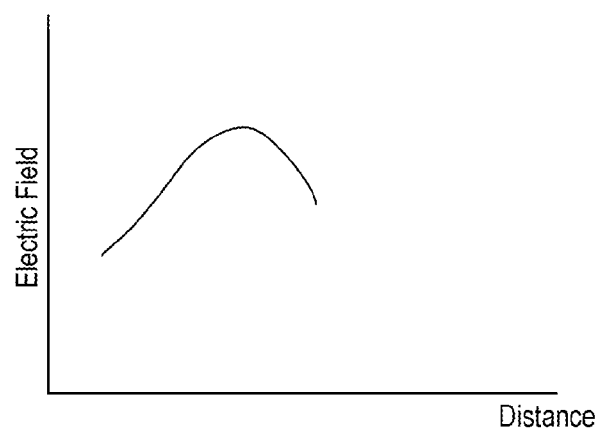
Figure 4A:
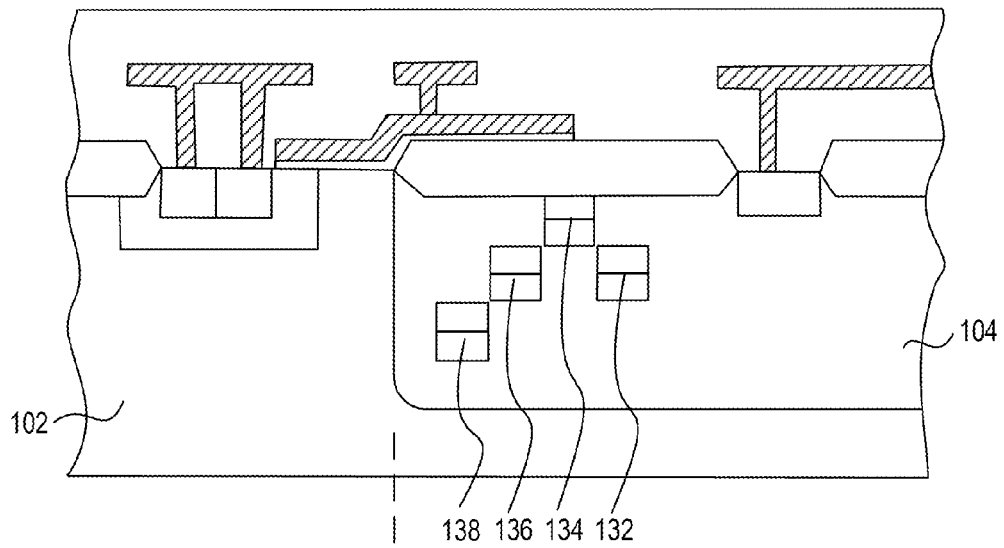
FIGS. 4a-4b show an example power semiconductor device consistent with some embodiments of this disclosure.
Figure 4B:
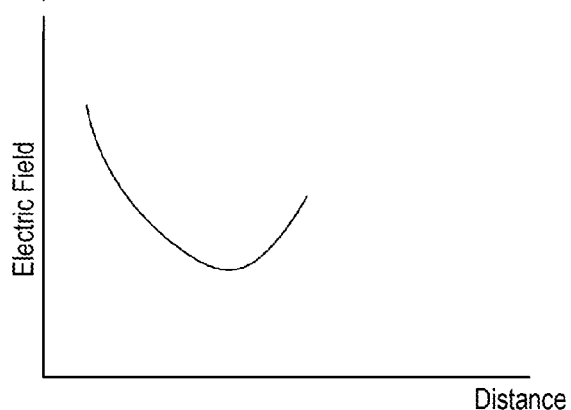

FIGS. 2-4 show some other embodiments of this disclosure. Legends similar to those in FIG. 1 are omitted for brevity. FIGS. 2b, 3b, and 4b show different electric field distribution profiles of devices before doped regions 132, 134, 136, 138 are disposed in well region 104 in each of devices 11, 12, and 13.

After an electric field distribution profile is determined, doped regions 132, 134, 136, 138 may be arranged based on the determined profile. For example, referring to FIG. 2 which shows an example semiconductor device 11, depths of doped regions 132, 134, 136, 138 as measured from the surface of substrate 102 are set in a descending order as the electric field decreases in well region 104 in a direction from source region 111 to drain region 112. Legends not mentioned here and similar to those in FIG. 1a are omitted for brevity.

Referring to FIG. 3 which shows another example semiconductor device 12, doped region 134 having the largest depth is arranged between doped regions 132 and 136, while doped region 138 is arranged adjacent to the surface of substrate 102 based on the determined profile as shown in FIG. 3b. As shown in FIGS. 3a and 3b, the doped region 134 is arranged deeper in well region 104 where the electric field is stronger, while doped region 138 is arranged adjacent to the surface where the electric field is weaker.

Referring to FIG. 4 which shows another example semiconductor device 13, doped region 134 having the least depth is arranged between doped regions 132 and 136, while doped region 138 is arranged to have the largest depth from the surface of substrate 102 based on the determined profile in FIG. 4b. As shown in FIGS. 4a and 4b, the doped region 138 is arranged deeper in well region 104 where the electric field is stronger, while doped region 134 is arranged adjacent to the surface where the electric field is weaker.

It can be appreciated that the locations or depths of doped regions are not limited to the above example embodiments. Further, it can be appreciated that the locations or depths of doped regions may be modified based on design parameters other than electric field distribution profile. Example parameters may be With the above example structures, it is possible to increase the breakdown voltage of a power semiconductor device and at the same time to reduce the ON-resistance. Moreover, because of the inclusion of doped regions 132, 134, 136, 138 in semiconductor devices 10-13, it is possible to reduce the overall size of the device, and therefore, increase the number of the device per unit area.

Figure 5A:
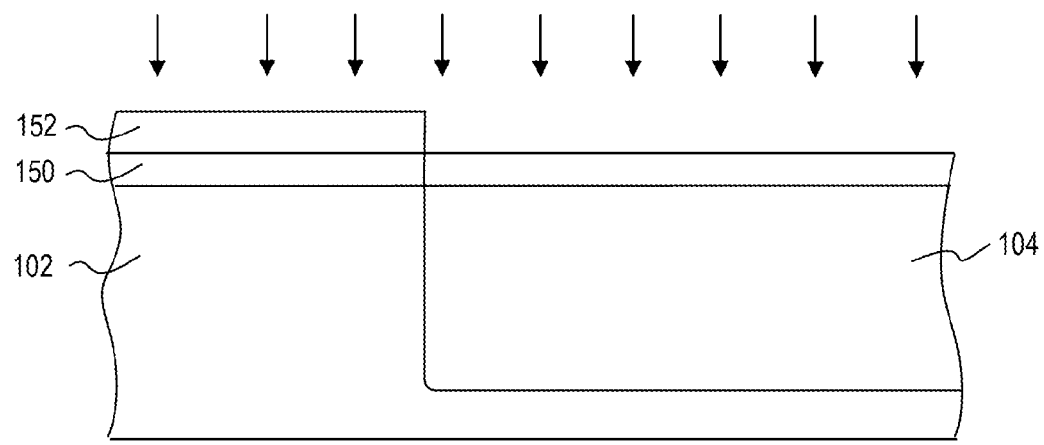
FIGS. 5a-5e show example methods of manufacturing a power semiconductor device consistent with some embodiments of this disclosure.

Next, example methods of manufacturing power semiconductor device 10 of FIG. 1a will be described with corresponding figures. Referring to FIG. 5a, a p-type semiconductor substrate 102 is prepared for processing. Preparation of substrate 102 may include cleaning or other treatment to provide a suitable surface for subsequent steps. Substrate 102 is provided with a sacrificing layer 150 for conducting implantation. Semiconductor substrate 102 may be a silicon substrate, silicon on insulator (SOI) substrate, SiGe substrate or other suitable semiconductor substrate. Sacrificing layer 150 may be an oxide, nitride, or oxynitride layer, for example. An implantation protection layer 152, such as a photoresist layer, is provided on sacrificing layer 150. Implantation protection layer 152 is patterned to expose a region where an implant will be applied. Next, an n-type implant is implanted into substrate 102 to form well region 104. A doping concentration of the n-type implant for the well region is set to be higher than that of substrate 102, and about, for example, 1e11 to 1e13 atoms/cm$^2$ or, in some embodiments, about 1e11 to 5e12 atoms/cm$^2$. After n-type implant is implanted into substrate 102, post-implantation steps, such as annealing and removal of sacrificing layer 150 and implantation protection layer 152, may be applied.

Figure 5B:
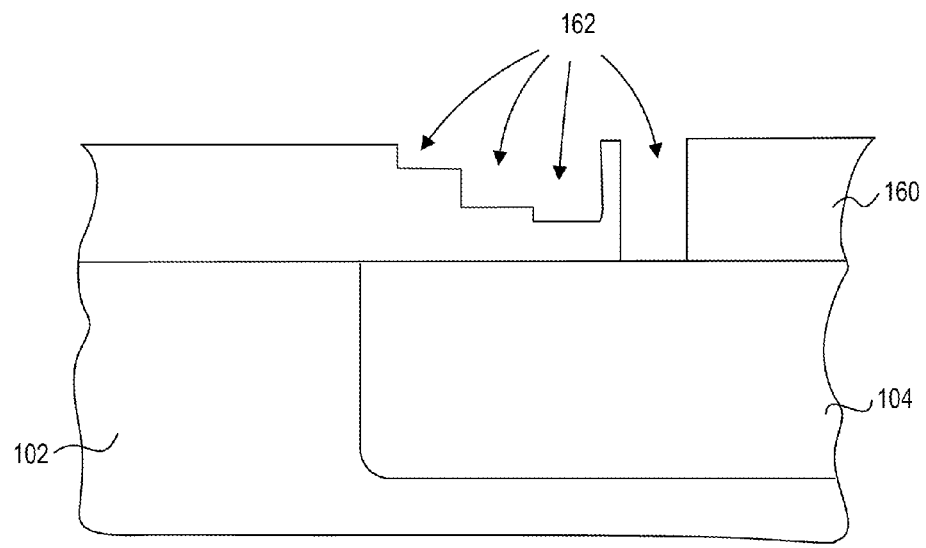

Referring to FIG. 5b, a mask layer 160, such as a hard mask, is formed on substrate 102. Mask layer 160 may include an oxide, nitride, or oxynitride, or other organic material. Mask layer 160 may be formed by physical or chemical vapor deposition or other suitable coating processes. Mask layer 160 is then patterned to form holes 162 such that at least one of holes 162 penetrates mask layer 160 to expose a surface of substrate 102 at well region 104. Further, a portion of holes 162 is patterned to form a staircase structure. As shown in FIG. 5b, the holes have different depths from an upper surface of mask layer 160. Alternatively, mask layer 160 may be printed on substrate 102 with holes 162. In some embodiments, a thin sacrificing layer similar to sacrificing layer 150 shown in FIG. 5a may be provided to interpose between mask layer 160 and substrate 102. In some embodiments, before patterning mask layer 160 to form holes 162, an electric field distribution profile in the well region is determined. The depths and locations of holes 162 in mask layer 160 may be determined based on the determined electric field distribution profile.

Figure 5C:
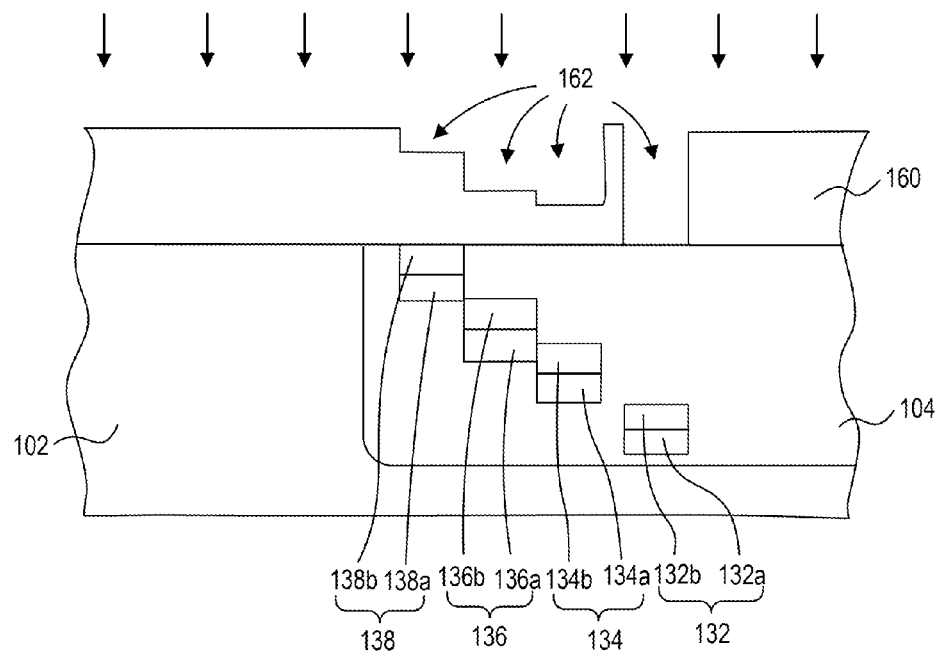

Referring to FIG. 5c, a p-type implant is implanted into well region 104, via mask layer 160, to simultaneously form p-type lower portions 132a, 134a, 136a, 138a. The p-type implant may be implanted with same implantation energy for p-type lower portions 132a, 134a, 136a, 138a. Moreover, an n-type implant is implanted into well region 104, via mask layer 160 to simultaneously form n-type upper portions 132b, 134b, 136b, 138b, respectively stacking on lower portions 132a, 134a, 136a, 138a, so as to form doped regions 132, 134, 136, and 138. The n-type implant may be implanted with same implantation energy to form n-type upper portions 132b, 134b, 136b, 138b. However, the sequence of the implantation is not limited. In some embodiments, the n-type implant may be implanted into well region 104 before the p-type implant. A doping concentration of the p-type implant for p-type lower portions 132a, 134a, 136a, 138a, or of the n-type implant for n-type upper portions 132b, 134b, 136b, 138b may be set to be about, for example, 1e11 to 1e13 atoms/cm$^2$ so that the doping concentrations in doped regions 132, 134, 136, and 138 are higher than that of well region 104. In some embodiments, p-type lower portions 132a, 134a, 136a, 138a are doped with a p-type implant at a concentration higher than the concentration for well region 104, while n-type upper portions 132b, 134b, 136b, 138b are doped with an n-type implant at a concentration lower than the concentration for well region 104.

Figure 5D:
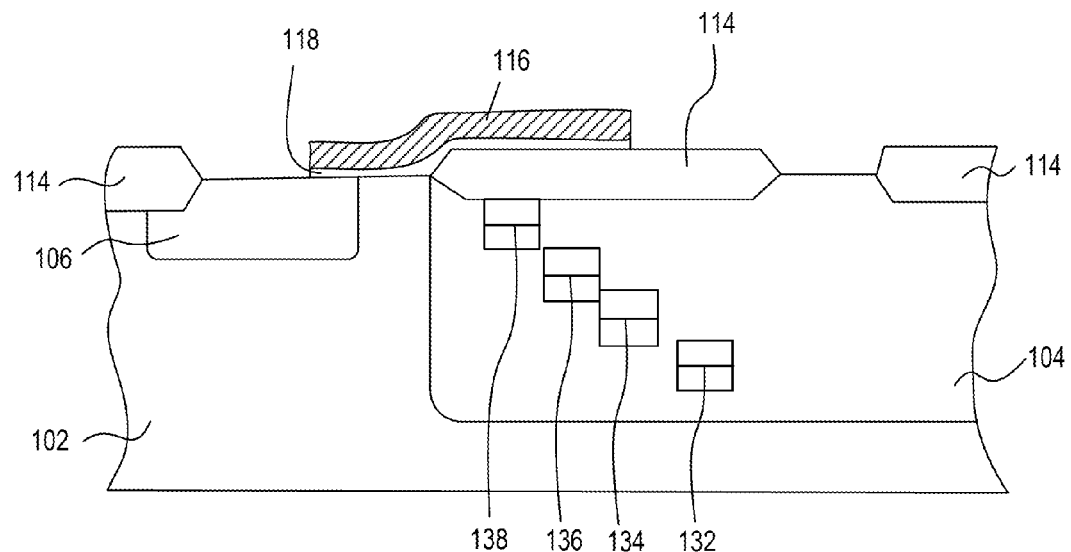

Referring to FIG. 5d, a p-type implant is implanted into substrate 102 to form body region 106. Although not shown in FIG. 5d, another set of sacrificing layer 150 and implantation protection layer 152 similar to those in FIG. 5a may be utilized to form body region 106 during the implantation. A doping concentration of the p-type implant for the body region is set to be about, for example, 1e11 to 1e14 atoms/cm$^2$.

Still referring to FIG. 5d, after well region 104, body region 106, and doped regions 132, 134, 136, 138 are formed in substrate 102, an insulating layer 114 is formed on the surface of substrate 102. Insulating layer 114 may be an oxide, nitride, or oxynitride. Insulating layer 114 may be formed by oxidation and/or nitridation of the substrate, or deposition of oxide, nitride, and/or oxynitride materials on the substrate. As shown in FIG. 5d, insulating layer 114 is formed on substrate 102 to expose a surface of substrate 102, well region 104, and body region 106.

Referring again to FIG. 5d, a gate insulating layer 118 is formed on substrate 102 to cover a portion of insulating layer 114, and a surface of substrate 102 and body region 106. Gate insulating layer 118 may be, for example, an oxide, nitride, or oxynitride. Moreover, a gate structure 116 is formed on gate insulating layer 118. Gate structure 116 may be of polysilicon, metal, or metal silicide, or other conductive material.

Figure 5E:
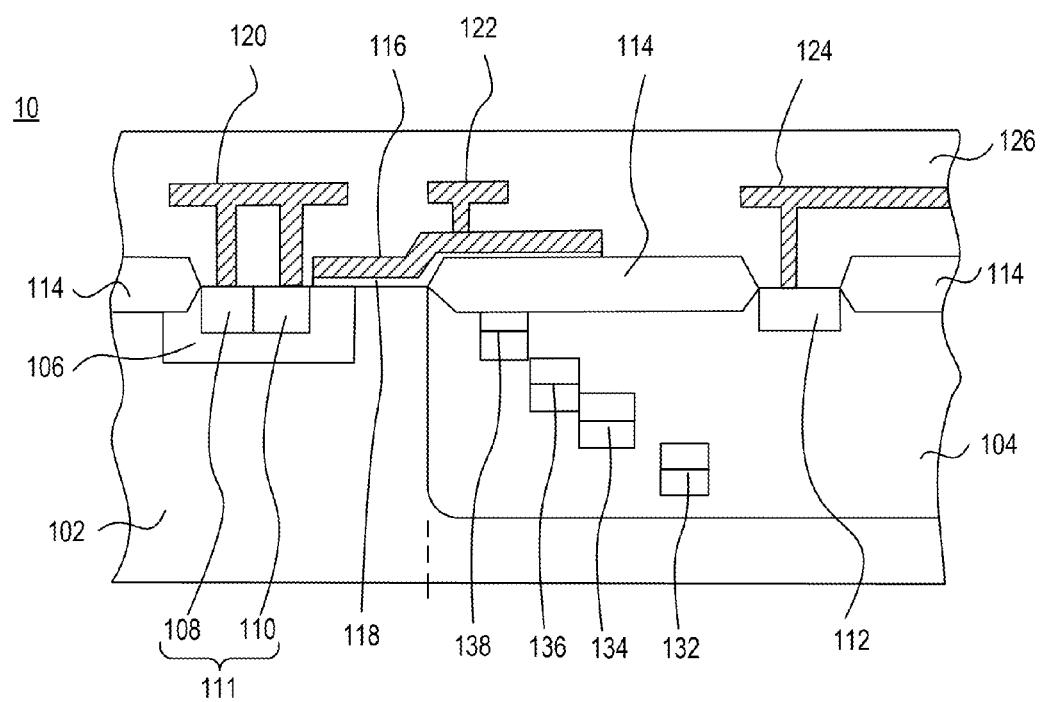

Referring to FIG. 5e, a source region 111 including p-type contact region 108 and an adjacent n-type contact region 110, and drain region 112 having a n-type contact region are respectively formed in body region 106 and well region 104. Source region 111 and drain region 112 may be formed by implanting corresponding implants into body region 106 and well region 104. Doping concentrations of the source region 111 and drain region 112 may be set at about, for example, 1e11 to 1e16 atoms/cm$^2$. In some embodiments, doping concentrations for the source and drain regions may be set at, for example, about 1e13 to 1e16 atoms/cm$^2$ or, in other embodiments, about 1e14 to 1e16 atoms/cm$^2$. Thereafter, a source electrode 120 is formed to electrically connect to p-type contact region 108 and n-type contact region 110. A drain electrode 124 is formed to electrically connect to drain region 112. A gate electrode 122 is formed to electrically connect to gate structure 116. These electrodes may be formed sequentially or at the same time. In addition, a material of these electrodes may be selected from polysilicon, metal, or metal silicide, or other conductive materials. In some embodiments, the materials of the electrodes and the gate structure may be the same. An interlayer dielectric layer 126 is deposited on substrate 102 to cover the electrodes. Although not illustrated, multiple layers of interconnection may be provided on the substrate in device 10.

Figure 6:
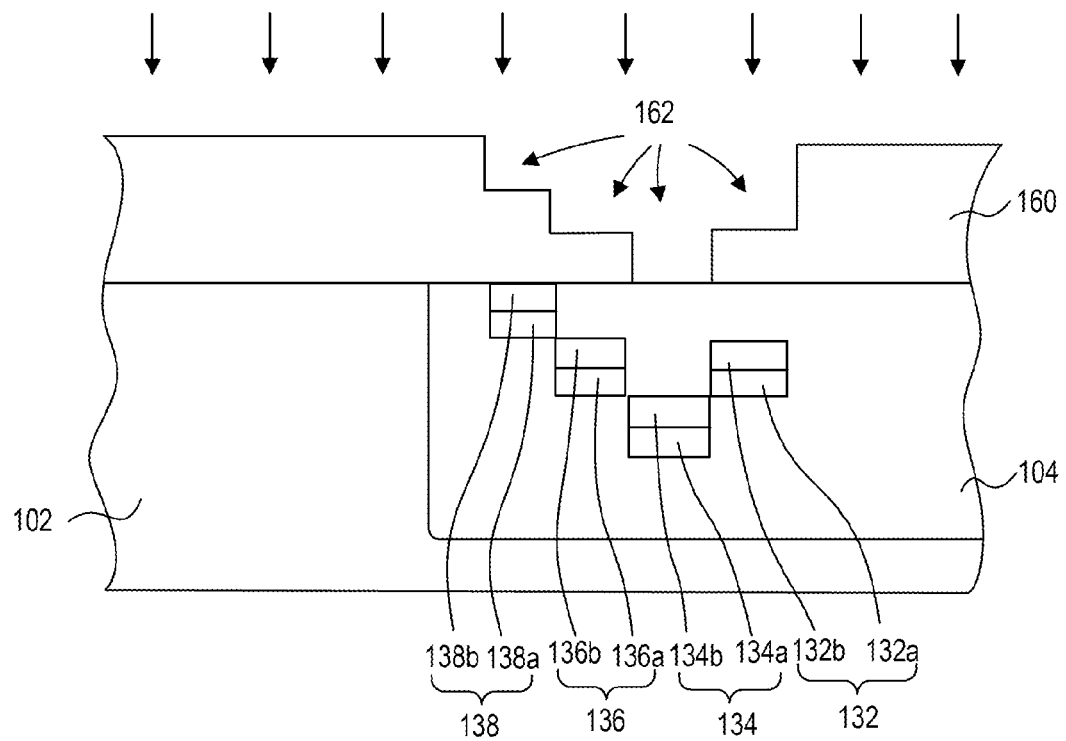
FIG. 6 shows other example methods of manufacturing a power semiconductor device consistent with some embodiments of this disclosure.

As shown in FIG. 5c, holes 162 provided in mask layer 160 allow simultaneously formation of p-type lower portions 132a, 134a, 136a, 138a or n-type upper portions 132b, 134b, 136b, 138b. P-type lower portions 132a, 134a, 136a, 138a may be vertically and horizontally offset from each other. N-type upper portions 132b, 134b, 136b, 138b may be vertically and horizontally offset from each other. In some embodiments, the contour of the holes in mask layer 160 may be modified based on how doped regions 132, 134, 136, 138 are arranged in well region 104. For example, as shown in FIG. 6, another mask layer 160 having holes 162 may be utilized to form doped regions 132, 134, 136, 138 in well region 104. Specifically, an implant going through hole 162 that has the largest depth from an upper surface of mask layer 160 produces doped region 134 that has the largest depth from the surface of substrate 102. And an implant going through hole 162 that has the least depth from the upper surface of mask layer 160 produces doped region 138 disposed adjacent to the surface of substrate 102.

Figure 7A:
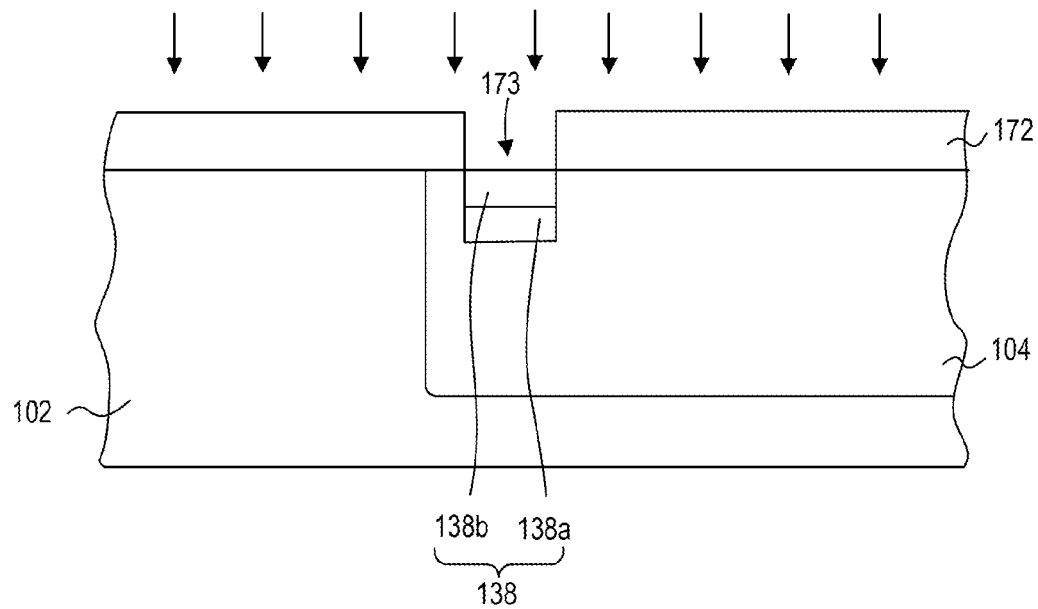
FIGS. 7a-7d shows other example methods of manufacturing a power semiconductor device consistent with some embodiments of this disclosure.

While it may be beneficial to form the upper portions or lower portions of doped regions 132, 134, 136, 138 simultaneously with a single mask layer, formation of the doped regions is not limited to this technique. In some embodiments, more than one mask layer may be employed. For example, referring to FIG. 7a, after substrate 102 is provided with well region 104, a first mask layer 172 is coated on substrate 102. First mask layer 172 is provided with a hole 173. P-type and n-type implants are respectively implanted into well region via hole 173 to form p-type lower portion 138a and n-type upper portion 138b, collectively a doped region 138. First mask layer 172 is then removed and a second mask layer 174 is coated on substrate 102 (FIG. 7b).

Figure 7B:
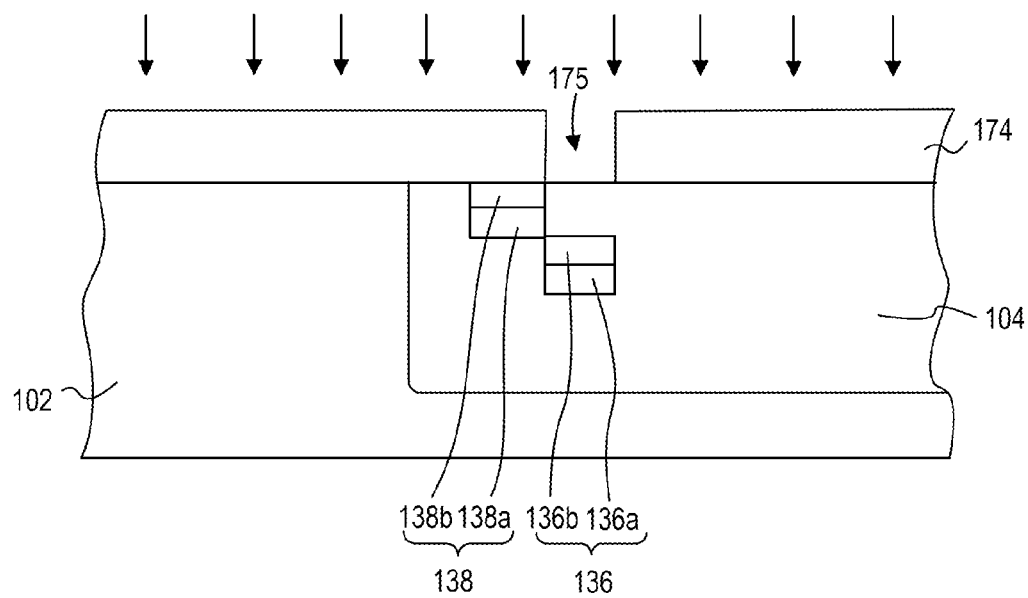

Referring to FIG. 7b, second mask layer 174 is provided with a hole 175. P-type and n-type implants are respectively implanted into well region via hole 175 to form p-type lower portion 136a and n-type upper portion 136b, collectively a doped region 136. Note that because doped region 136 is deeper in well region 104 than doped region 138, the implantation energy for forming doped region 136 may be higher than that for forming doped region 138. Second mask layer 174 is then removed and a third mask layer 176 is coated on substrate 102 (FIG. 7c).

Figure 7C:
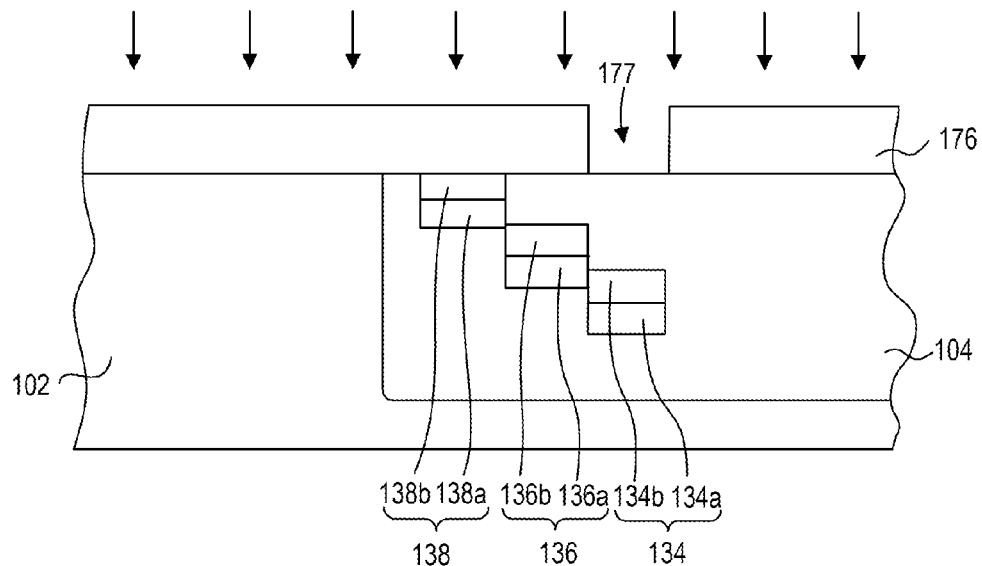

Referring to FIG. 7c, third mask layer 176 is provided with a hole 177. P-type and n-type implants are respectively implanted into well region via hole 177 to form p-type lower portion 134a and n-type upper portion 134b, collectively a doped region 134. Similarly, the implantation energy for forming doped region 134 may be higher than that for forming doped region 136 or 138. Third mask layer 176 is then removed and a fourth mask layer 178 is coated on substrate 102 (FIG. 7d).

Figure 7D:
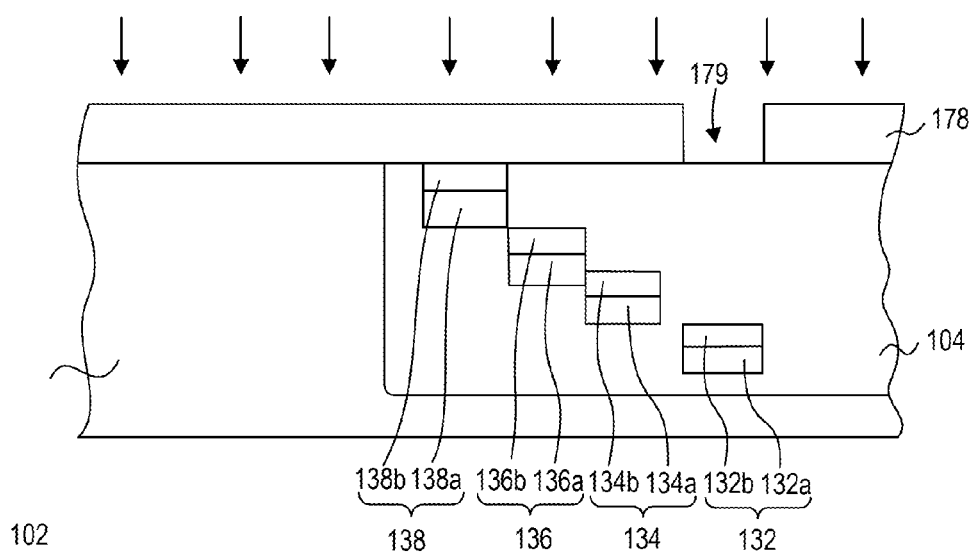

Referring to FIG. 7d, fourth mask layer 178 is provided with a hole 179. P-type and n-type implants are respectively implanted into well region via hole 179 to form p-type lower portion 132a and n-type upper portion 132b, collectively a doped region 132. The above steps may be repeated until all of the doped regions are arranged in the well region according to predetermined criteria.

Figure 8A:
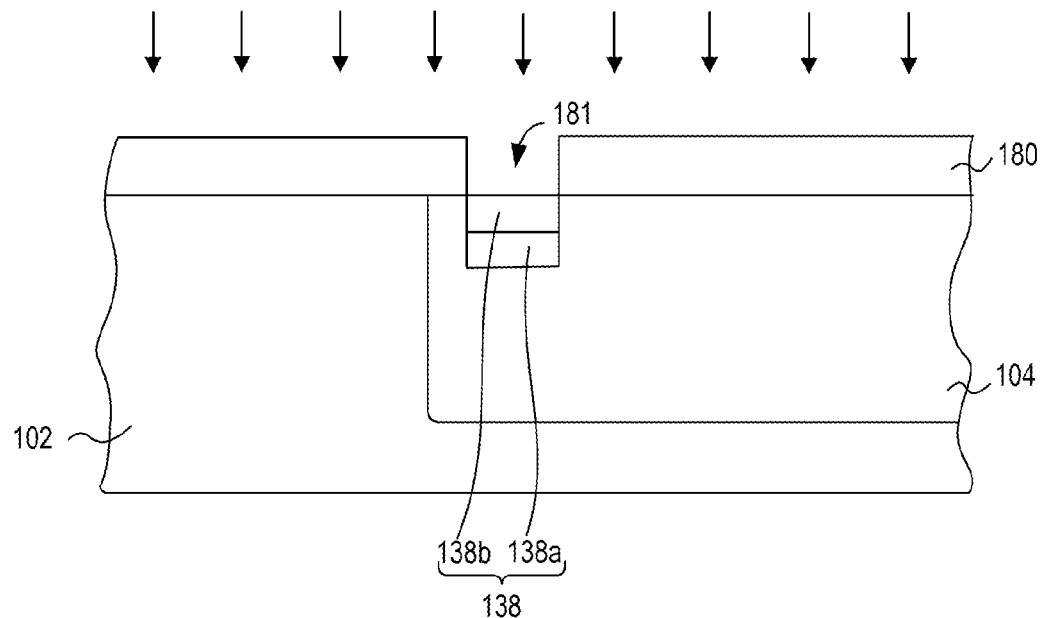
FIGS. 8a-8c shows other example methods of manufacturing a power semiconductor device consistent with some embodiments of this disclosure.
Figure 8B:
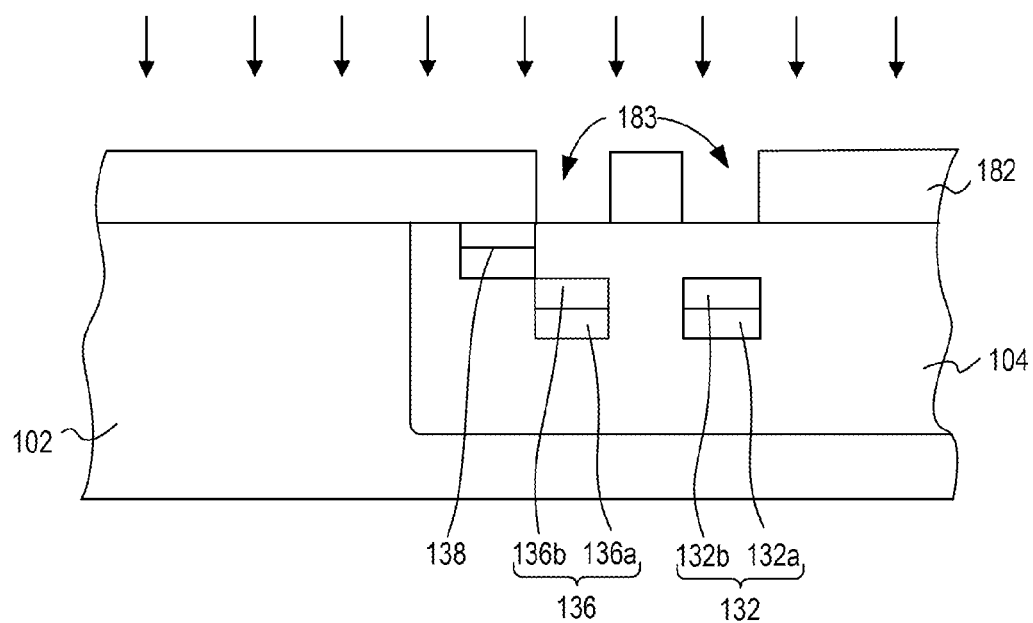
Figure 8C:
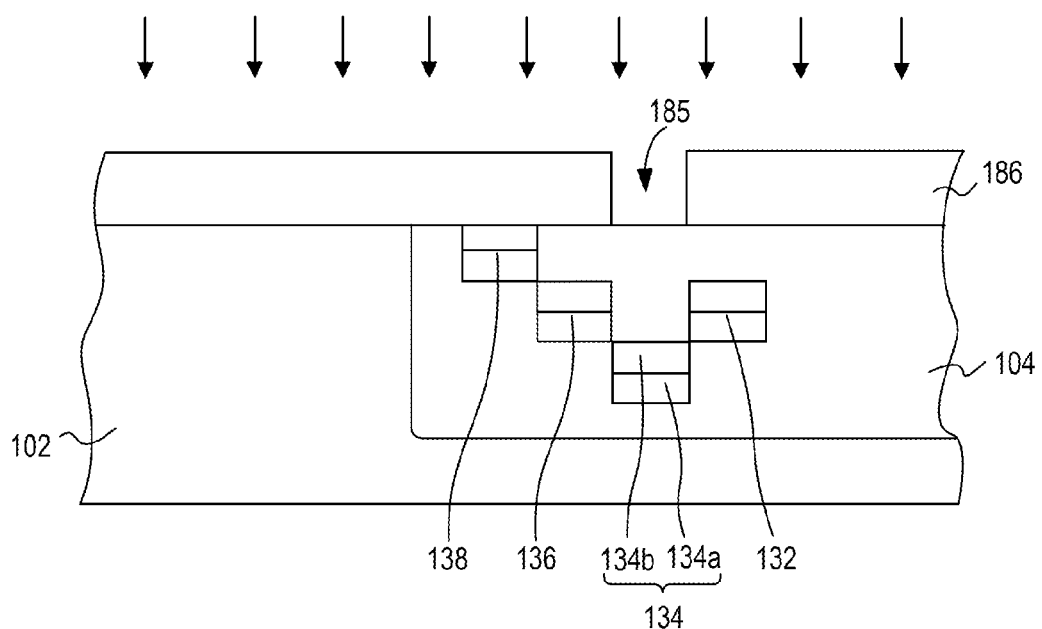

Another example method to form doped regions with a plurality of mask layers is shown in FIGS. 8a-8c. Referring to FIG. 8a, after substrate 102 is provided with well region 104, a first mask layer 180 is coated on substrate 102. First mask layer 180 is provided with a hole 181. P-type and n-type implants are respectively implanted into well region 104 via hole 181 to form p-type lower portion 138a and n-type upper portion 138b, collectively a doped region 138. First mask layer 180 is then removed and a second mask layer 182 is coated on substrate 102 (FIG. 8b).

Referring to FIG. 8b, second mask layer 182 is provided with two holes 183. A p-type implant is implanted into well region 104 via holes 183 to form p-type lower portions 136a and 132a, and an n-type implant is implanted into well region 104 via holes 183 to form n-type upper portions 136b and 132b. Thus, a single mask layer may be employed to form two doped regions 132 and 136. Note that because doped regions 132 and 136 are deeper in well region 104 than doped region 138, the implantation energy for forming doped regions 132 and 136 may be higher than that for forming doped region 138. Second mask layer 182 is then removed and a third mask layer 184 is coated on substrate 102 (FIG. 8c).

Referring to FIG. 8c, third mask layer 184 is provided with a hole 185. P-type and n-type implants are respectively implanted into well region via hole 185 to form p-type lower portion 134a and n-type upper portion 134b, collectively a doped region 134. Similarly, the implantation energy for forming doped region 134 may be higher than that for forming doped regions 132, 136, 138.

Consistent with embodiments discussed with FIGS. 1-4, in some embodiments, the above methods to form semiconductor devices may optionally include a step of determining an electric field distribution profile in the well region to determine locations and depths of the holes in the mask layers.

Although the example power semiconductor devices described above are n-type devices, power semiconductor devices consistent with some embodiments can be p-type. The structure of a p-type power semiconductor device can be the same as those of the n-type power semiconductor device as described above, but the conductivity type of the materials in a p-type power semiconductor device is set to be opposite to that of the n-type power semiconductor device.

Figure 9A:
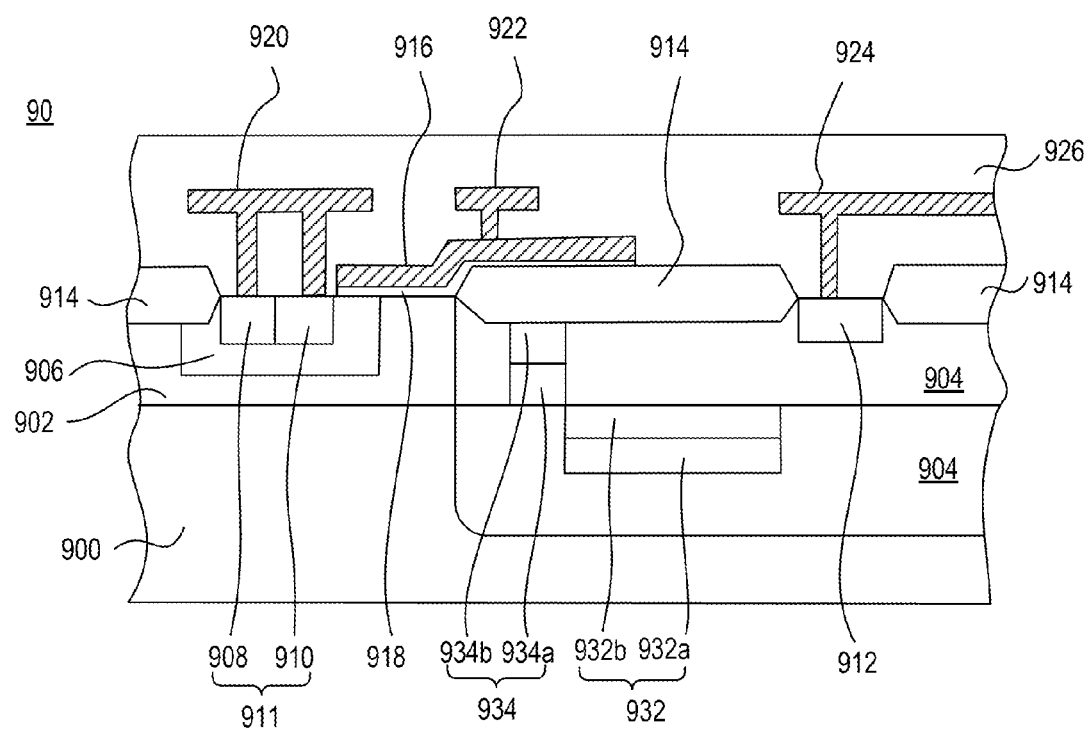
FIG. 9a shows another example power semiconductor device consistent with some embodiments of this disclosure.

FIG. 9a depicts another power semiconductor device 90 consistent with embodiments of this disclosure. Device 90 is an n-type device and includes a p-type substrate 900 and an epitaxial layer 902 disposed on substrate 900. A gate structure 916 and a field insulating layer 914 are disposed on epitaxial layer 902. A gate insulating layer 918 is disposed between gate structure 916 and epitaxial layer 902. A portion of gate insulating layer 918 extends to cover a portion of field insulating layer 914.

Figure 9B:
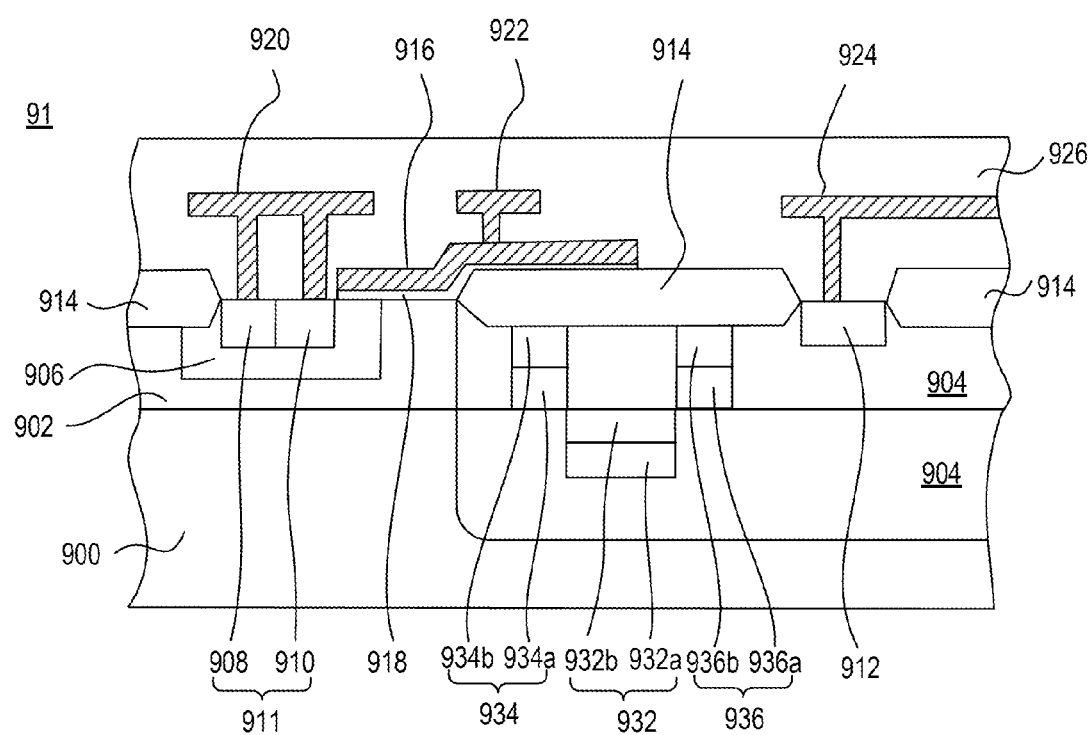
FIG. 9b shows another example power semiconductor device consistent with some embodiments of this disclosure.

Moreover, a p-type body region 906 is disposed in epitaxial layer 902. N-type well regions 904 are disposed in both substrate 900 and epitaxial layer 902. A p-type contact region 908 and an adjacent n-type contact region 910 collectively constitute a source region 911, which is disposed in body region 906. An n-type contact region constitutes a drain region 912 and is disposed in well region 904 in epitaxial layer 902. A doped region 932 is disposed in well region 904 of substrate 900. Doped region 932 includes a p-type lower portion 932a and an n-type upper portion 932b stacked on top of lower portion 932a. Further, a doped region 934 is disposed in well region 904 of epitaxial layer 902. Doped region 934 includes a p-type lower portion 934a and an n-type upper portion 934b stacked on top of lower portion 934a. Doped regions 932 and 934 are disposed between source region 911 and drain region 912. It can be appreciated that although one doped region is disposed in each of substrate 900 and epitaxial layer 902 as shown in FIG. 9a, each of substrate 900 and epitaxial layer 902 may include more than one doped region according to some embodiments. Referring to FIG. 9b which shows a semiconductor device 91, epitaxial layer 902 includes two doped regions 934 and 936 separated from each other.

Moreover, a conductive source electrode 920 is electrically connected to p-type contact region 908 and n-type contact region 910. A conductive drain electrode 924 is electrically connected to n-type contact region 912. A conductive gate electrode 922 is electrically connected to gate structure 916. An interlayer dielectric layer 926 is disposed to cover electrodes 920, 922, 924.

Figure 9C:
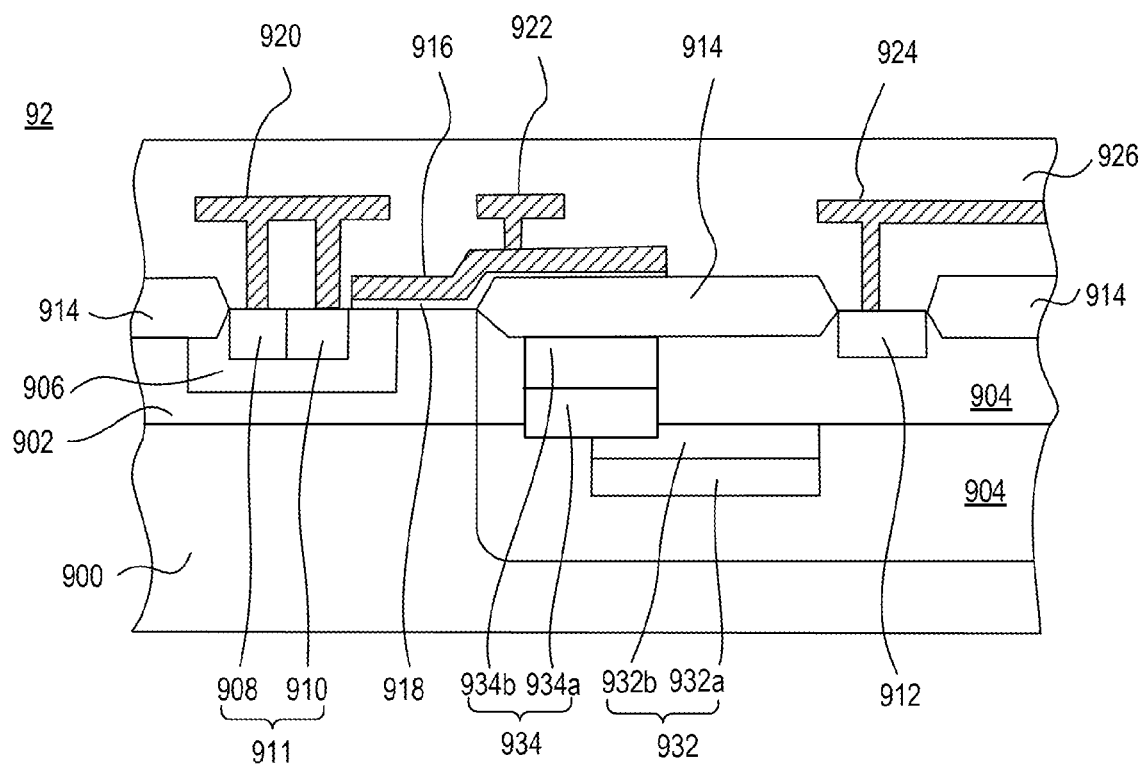
FIG. 9c shows another example power semiconductor device consistent with some embodiments of this disclosure.

Doped regions 932 and 934 are arranged in well regions 904 such that they are at least vertically and horizontally offset from each other. In FIG. 9a, doped regions 932 and 934 are vertically and horizontally separated from each other. However, in some embodiments, although vertically and horizontally offset, doped regions 932 and 934 may partially overlap with each other as shown in FIG. 9c which shows a semiconductor device 91.

Figure 10:
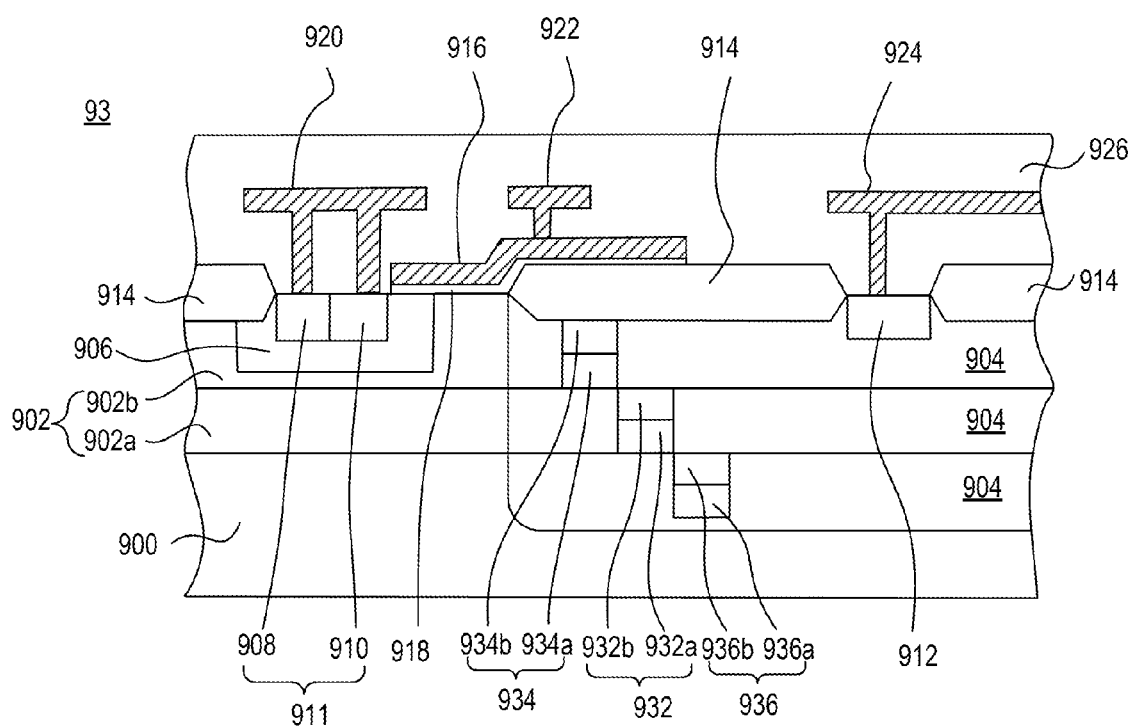
FIG. 10 shows another example power semiconductor device consistent with some embodiments of this disclosure.

In some embodiments, more than one epitaxial layer may be formed on substrate 900 in a power semiconductor device. Each epitaxial layer is provided with a well region and at least one doped region. Referring to FIG. 10, a power semiconductor device 93 is a n-type device and includes a p-type substrate 900 and two epitaxial layers 902a and 902b (collectively epitaxial structure 902) disposed on substrate 900. A gate structure 916 and a field insulating layer 914 are disposed on epitaxial layer 902b. A gate insulating layer 918 is disposed between gate structure 916 and epitaxial layer 902b. A portion of gate insulating layer 918 extends to cover a portion of field insulating layer 914. Although device 92 is shown to have two epitaxial layers, the number of epitaxial layers is not limited, and can be more than two.

Still referring to FIG. 10, a p-type body region 906 is disposed in epitaxial layer 902b. N-type well regions 904 are disposed in both substrate 900 and epitaxial layers 902a and 902b so that these well regions form a continuous well region. A p-type contact region 908 and an adjacent n-type contact region 910 collectively constitute a source region 911, which is disposed in body region 906. An n-type contact region constitutes a drain region 912 and is disposed in well region 904 in epitaxial layer 902b. A doped region 932 is disposed in well region 904 of substrate 900. Doped region 932 includes a p-type lower portion 932a and an n-type upper portion 932b stacked on top of lower portion 932a. Further, doped regions 934 and 936 are disposed in well regions 904 of epitaxial layers 902a and 902b, respectively. Doped regions 934 includes a p-type lower portion 934a and an n-type upper portion 934b stacked on top of lower portion 934a. Doped regions 936 includes a p-type lower portion 936a and an n-type upper portion 936b stacked on top of lower portion 936a. Doped regions 932, 934, 936 are disposed between source region 911 and drain region 912. It can be appreciated that although one doped region is disposed in each of substrate 900 and epitaxial layers 902a, 902b as shown in FIG. 10, each of substrate 900 and epitaxial layers 902a, 902b may include more than one doped region according to some embodiments. Moreover, in some embodiments, doped region 934 of epitaxial layer 902a or doped region 932 of substrate 900 may be omitted from FIG. 10.

Moreover, a conductive source electrode 920 is electrically connected to p-type contact region 908 and n-type contact region 910. A conductive drain electrode 924 is electrically connected to n-type contact region 912. A conductive gate electrode 922 is electrically connected to gate structure 916. An interlayer dielectric layer 926 is disposed to cover electrodes 920, 922, 924.

Doped regions 932, 934, 936 are arranged in well regions 904 such that they are at least vertically and horizontally offset from each other. It should be noted that well region 904 or doped region 932 in substrate 900 as shown in FIG. 10 may be omitted.

Figure 11A:
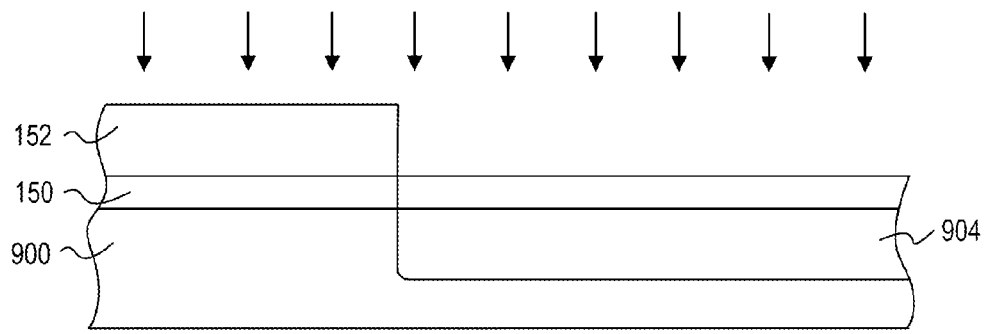
FIGS. 11a-11h show example methods of manufacturing a power semiconductor device consistent with some embodiments of this disclosure.

Next, example methods of manufacturing devices 92 as shown in FIG. 10 will be described with corresponding figures. Referring to FIG. 11a, a p-type semiconductor substrate 902 is prepared for processing. Substrate 900 is provided with a sacrificing layer 150 for conducting implantation. Semiconductor substrate 900 may be a silicon substrate, silicon on insulator (SOI) substrate, SiGe substrate or other suitable semiconductor substrate. Sacrificing layer 150 may be an oxide, nitride, or oxynitride layer, for example. An implantation protection layer 152, such as a photoresist layer, is provided on sacrificing layer 150. Implantation protection layer 152 is patterned to expose a region where an implant will be applied. Next, an n-type implant is implanted into substrate 900 to form well region 904. A doping concentration of the n-type implant for well region 904 is set to be higher than that of substrate 900, and about, for example, 1e11 to 1e13 atoms/cm$^2$ or, in some embodiments, about 1e11 to 5e12 atoms/cm$^2$. After n-type implant is implanted into substrate 900, sacrificing layer 150 and implantation protection layer 152 are removed from substrate 900.

Figure 11B:
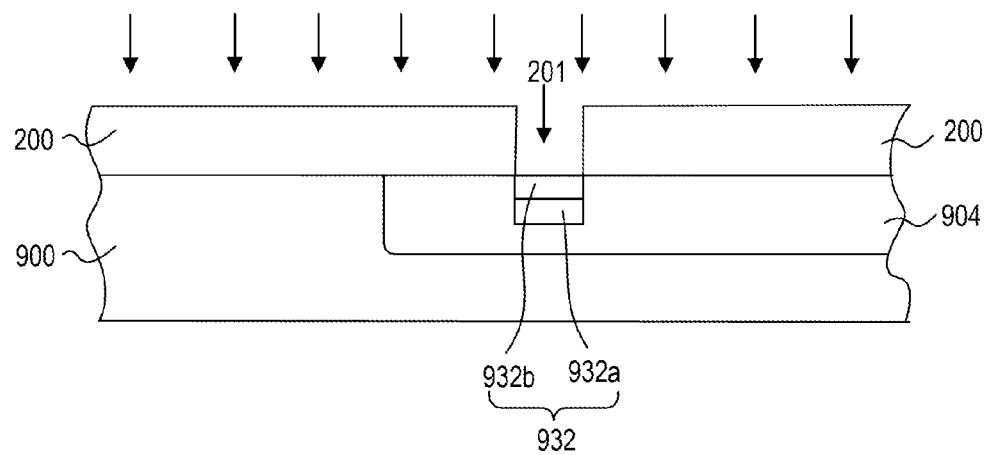

Referring to FIG. 11b, a mask layer 200 such as a hard mask is formed on substrate 900. Mask layer 200 may include an oxide, nitride, or oxynitride, or other organic material. Mask layer 200 may be formed by physical or chemical vapor deposition or other suitable coating processes. Mask layer 200 is then patterned to form a hole 201 penetrating mask layer 200 to expose a surface of substrate 900 at well region 904. Alternatively, mask layer 200 may be printed on substrate 900 with a plurality of holes 201. In some embodiments, a thin sacrificing layer similar to sacrificing layer 150 shown in FIG. 11a may be provided to interpose between mask layer 200 and substrate 900.

Still referring to FIG. 11b, a p-type implant is implanted into well region 904, via mask layer 200, to form p-type lower portion 932a. Moreover, an n-type implant is implanted into well region 104, via mask layer 200, to form n-type upper portion 932b stacking on lower portion 932a, so as to form doped region 932. However, the sequence of the implantation is not limited. In some embodiments, the n-type implant may be implanted into well region 104 before the p-type implant. A doping concentration of the p-type implant for p-type lower portion 932a, or of the n-type implant for n-type upper portion 932b may be set to be about, for example, 1e11 to 1e13 atoms/cm$^2$ so that the doping concentration in doped region 932 is higher than that of well region 904. In some embodiments, p-type lower portion 932a is doped with a p-type implant at a concentration higher than the concentration for well region 904, while n-type upper portion 932b is doped with an n-type implant at a concentration lower than the concentration for well region 904.

Figure 11C:
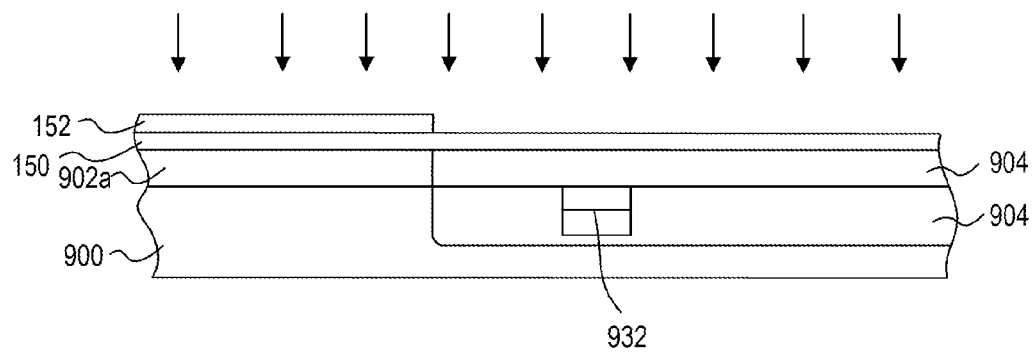

Referring to FIG. 11c, a first p-type epitaxial layer 902a is grown on substrate 900. Epitaxial layer 902a may include material(s) the same as or different from that of substrate 900. A sacrificing layer 150 and implantation protection layer 152 similar to those shown in FIG. 11a for conducting implantation is provided on epitaxial layer 902a. An n-type implant is implanted into epitaxial layer 902a to form well region 904 therein. A doping concentration of the n-type implant for well region 904 is set to be higher than that of epitaxial layer 902a, and about, for example, 1e11 to 1e13 atoms/cm$^2$ or, in some embodiments, about 1e11 to 5e12 atoms/cm$^2$. After n-type implant is implanted into epitaxial layer 902a, sacrificing layer 150 and implantation protection layer 152 are removed from epitaxial layer 902a.

Figure 11D:
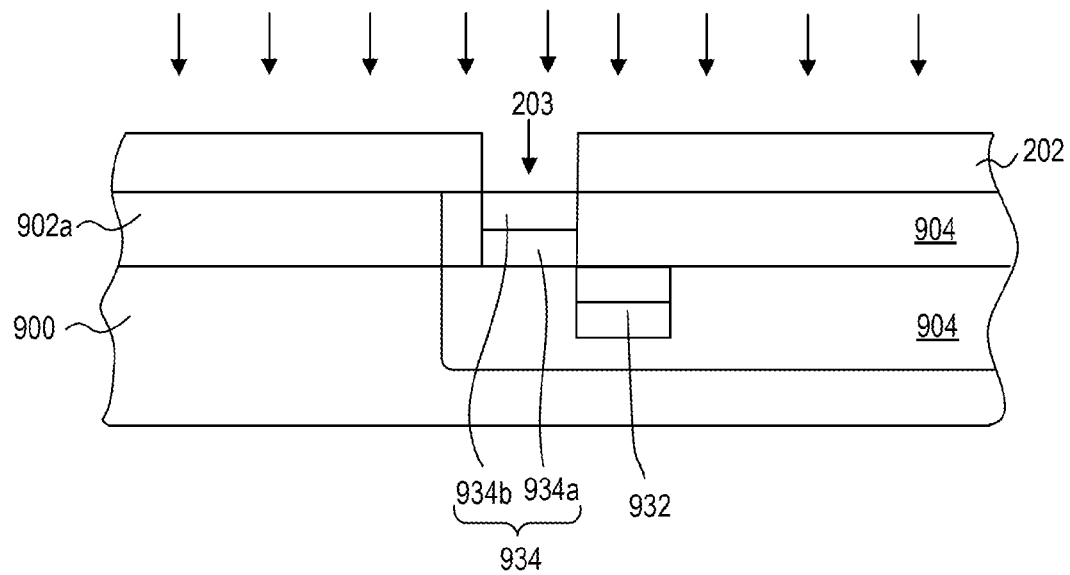

Referring to FIG. 11d, another mask layer 202 such as a hard mask is formed on epitaxial layer 902a. Mask layer 202 is patterned to form a hole 203 penetrating mask layer 202 to expose a surface of epitaxial layer 902a at well region 904. Alternatively, mask layer 202 may be printed on epitaxial layer 902a with holes 203. In some embodiments, a thin sacrificing layer similar to sacrificing layer 150 shown in FIG. 11a may be provided to interpose between mask layer 202 and epitaxial layer 902a.

Still referring to FIG. 11d, a p-type implant and an n-type implant are respectively implanted into well region 904 of epitaxial layer 902a, via mask layer 202, to form p-type lower portion 934a and n-type upper portion 934b on lower portion 934a, so as to form doped region 934. A doping concentration of the p-type implant for p-type lower portion 934a, or of the n-type implant for n-type upper portion 934b may be set to be about, for example, 1e11 to 1e13 atoms/cm$^2$ so that the doping concentration in doped region 934 is higher than that of well region 904 of epitaxial layer 902a. In some embodiments, p-type lower portion 934a is doped with a p-type implant at a concentration higher than the concentration for well region 904, while n-type upper portion 934b is doped with an n-type implant at a concentration lower than the concentration for well region 904.

Figure 11E:
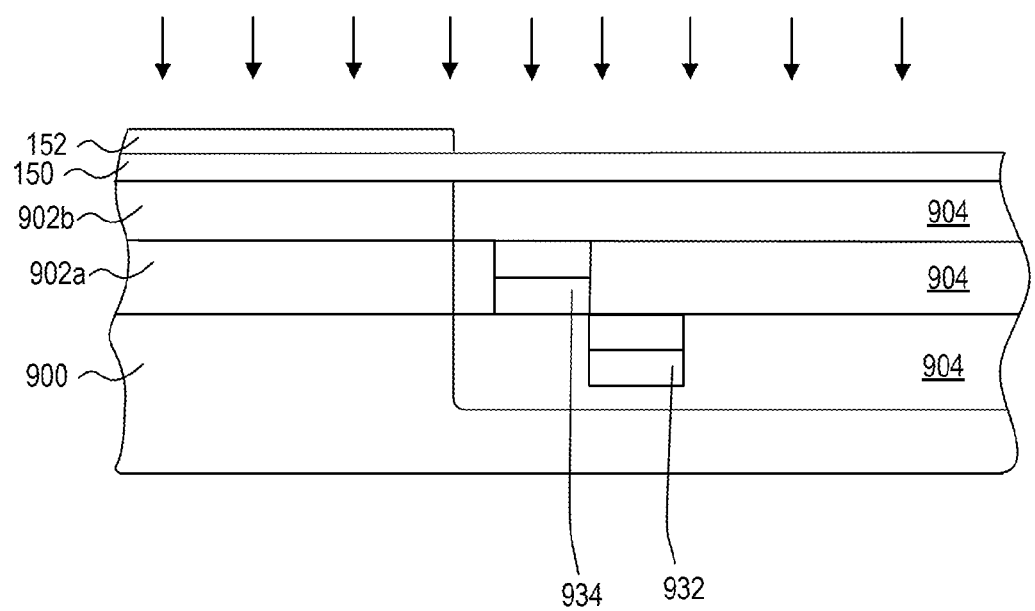

Referring to FIG. 11e, a second p-type epitaxial layer 902b is grown on epitaxial layer 902a. A sacrificing layer 150 and implantation protection layer 152 similar to those shown in FIG. 11a for conducting implantation is provided on epitaxial layer 902b. An n-type implant is implanted into epitaxial layer 902b to form well region 904 therein. A doping concentration of the n-type implant for well region 904 is set to be higher than that of epitaxial layer 902a, and about, for example, 1e11 to 1e13 atoms/cm$^2$ or, in some embodiments, about 1e11 to 5e12 atoms/cm$^2$. After n-type implant is implanted into epitaxial layer 902b, sacrificing layer 150 and implantation protection layer 152 are removed from epitaxial layer 902b.

Figure 11F:
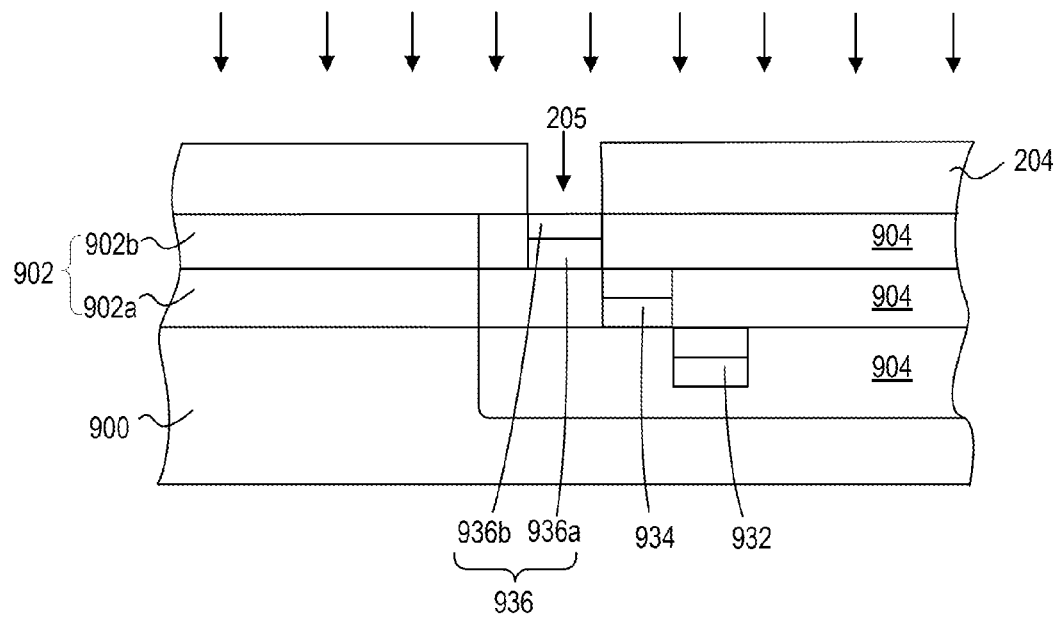

Referring to FIG. 11f, a mask layer 204 such as a hard mask is formed on epitaxial layer 902b. Mask layer 204 is patterned to form a hole 205 penetrating mask layer 204 to expose a surface of epitaxial layer 902b at well region 904. Alternatively, mask layer 204 may be printed on epitaxial layer 902b with holes 205. In some embodiments, a thin sacrificing layer similar to sacrificing layer 150 shown in FIG. 11a may be provided to interpose between mask layer 204 and epitaxial layer 902b.

Still referring to FIG. 11f, a p-type implant and an n-type implant are respectively implanted into well region 904 of epitaxial layer 902b, via mask layer 204, to form p-type lower portion 936a and n-type upper portion 936b on lower portion 936a, so as to form doped region 936. A doping concentration of the p-type implant for p-type lower portion 936a, or of the n-type implant for n-type upper portion 936b may be set to be about, for example, 1e11 to 1e13 atoms/cm$^2$ so that the doping concentration in doped region 936 is higher than that of well region 904 of epitaxial layer 902b. In some embodiments, p-type lower portion 936a is doped with a p-type implant at a concentration higher than the concentration for well region 904, while n-type upper portion 936b is doped with an n-type implant at a concentration lower than the concentration for well region 904.

Figure 11G:
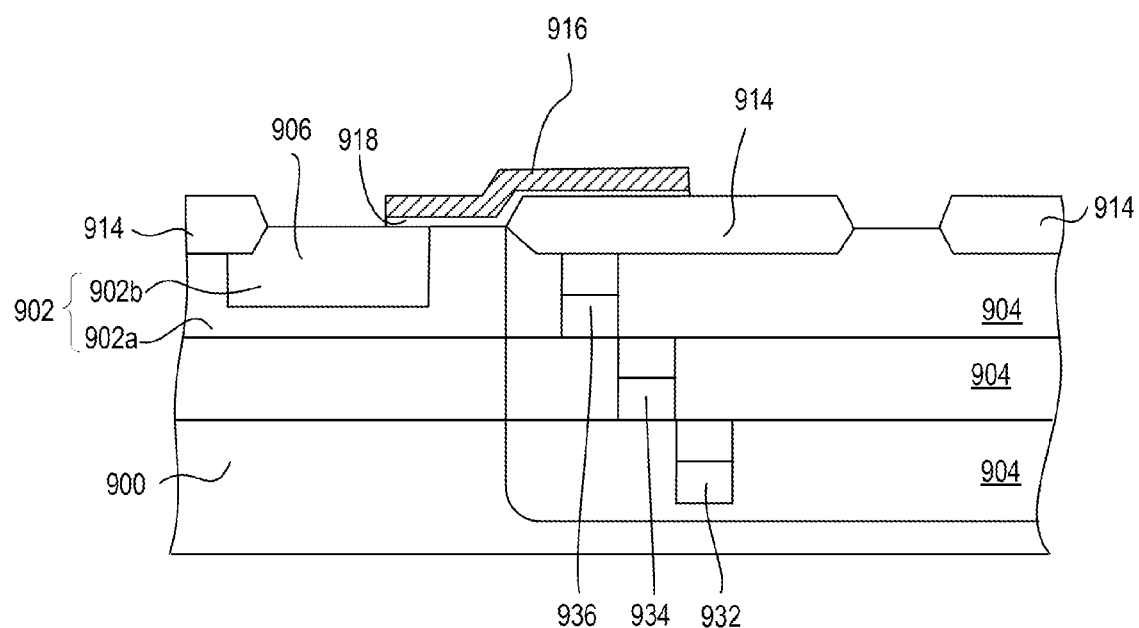

Referring to FIG. 11g, a p-type implant is implanted into epitaxial layer 902b to form body region 906. Although not shown in FIG. 11g, another set of sacrificing layer 150 and implantation protection layer 152 similar to those in FIG. 11a may be utilized to form body region 906. A doping concentration of the p-type implant for the body region is set to be about, for example, 1e11 to 1e14 atoms/cm$^2$.

Still referring to FIG. 11g, after well region 904, body region 906, and doped regions 932, 934, 936 are formed, an insulating layer 914 is formed on the surface of epitaxial layer 902b. Insulating layer 914 may be an oxide, nitride, or oxynitride. Insulating layer 914 may be formed by oxidation and/or nitridation of epitaxial layer 902b, or deposition of oxide, nitride, and/or oxynitride materials on epitaxial layer 902b. As shown in FIG. 11g, insulating layer 914 is formed on epitaxial layer 902b to expose well region 904, body region 906, and a surface of epitaxial layer 902b adjacent to body region 906.

Referring again to FIG. 11g, a gate insulating layer 918 is formed on epitaxial layer 902b to cover a portion of insulating layer 914, and a surface of epitaxial layer 902b and body region 906. Gate insulating layer 918 may be, for example, an oxide, nitride, or oxynitride. Moreover, a gate structure 916 is formed on gate insulating layer 918. Gate structure 916 may be of polysilicon, metal, or metal silicide, or other conductive material.

Figure 11H:
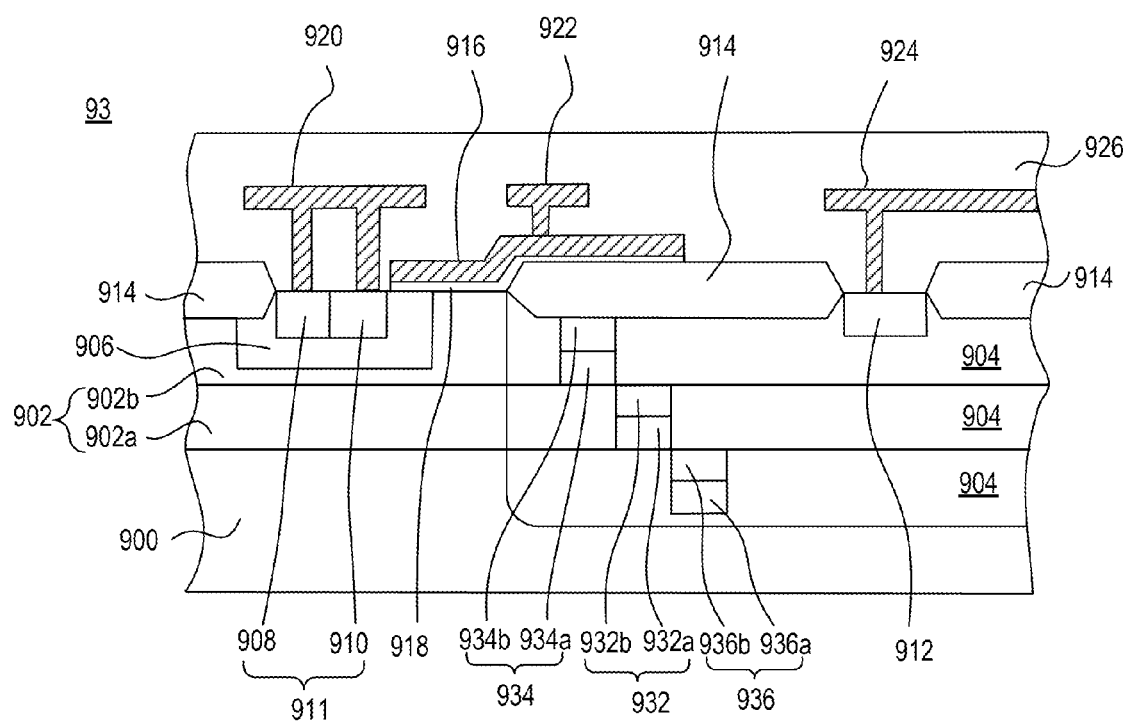

Referring to FIG. 11h, a source region 911 including a p-type contact region 908 and an adjacent n-type contact region 910, and drain region 912 are respectively formed in body region 906 and well region 904. Source region 911 and drain region 912 may be formed by implanting corresponding implants into body region 906 and well region 904. Doping concentrations of source region 911 and drain region 912 may be, for example, about 1e11 to 1e16 atoms/cm$^2$. In some embodiments, doping concentrations for the source and drain regions may be set at, for example, about 1e13 to 1e16 atoms/cm$^2$ or, in other embodiments, about 1e14 to 1e16 atoms/cm$^2$. Thereafter, a conductive source electrode

920 is formed to electrically connect to p-type contact region 908 and n-type contact region 910. A conductive drain electrode 924 is formed to electrically connect to n-type contact region 912. A conductive gate electrode 922 is formed to electrically connect to gate structure 916. These electrodes may be formed sequentially or at the same time. In addition, a material of these electrodes may be selected from polysilicon, metal, or metal silicide, or other conductive materials. In some embodiments, the materials of the electrodes and the gate structure may be the same. An interlayer dielectric layer 926 is deposited on epitaxial layer 902*b* to cover the electrodes. Although not illustrated, multiple layers of interconnection may be provided on the electrodes in the power semiconductor device.

Although the example power semiconductor devices described above in FIGS. 9-11 are n-type devices, power semiconductor devices consistent with some embodiments can be p-type. The structure of a p-type power semiconductor device can be the same as those of the n-type power semiconductor device as described above, but the conductivity type of the materials in a p-type power semiconductor device is set to be opposite to that of the n-type power semiconductor device.

Certain adaptations and modifications of the described embodiments can be made. Therefore, the above discussed embodiments are considered to be illustrative and not restrictive.

What is claimed is:

1. A semiconductor device comprising:
   a substrate having a first conductivity type;
   an epitaxial structure having the first conductivity type disposed on the substrate;
   a drain region and a source region disposed in the epitaxial structure;
   a well region interposed between the drain region and the source region, the well region being disposed in the substrate and the epitaxial structure, the well region having a second conductivity type opposite to the first conductivity type;
   a first doped region disposed in the well region of the substrate; and
   a second doped region disposed in the well region of the epitaxial structure;
   the first doped region and the second doped region being vertically and horizontally offset from each other;
   each of the doped regions comprising a lower portion having the first conductivity type, and an upper portion stacked on the lower region and having the second conductivity type.

2. The semiconductor device according to claim 1, wherein:
   the epitaxial structure is composed of a single epitaxial layer.

3. The semiconductor device according to claim 1, wherein:
   the epitaxial structure is composed of a plurality of epitaxial layers; and
   the second doped region is disposed in the uppermost layer of the epitaxial layers.

4. The semiconductor device according to claim 3, wherein:
   each of the epitaxial layers includes at least a doped region; and
   the doped regions are vertically and horizontally offset from each other.

5. The semiconductor device according to claim 1, wherein depths of the doped regions from a surface of the substrate are set in an ascending or descending order in a direction from the source region to the drain region.

6. The semiconductor device according to claim 1, wherein depths of the doped regions from a surface of the substrate are set such that one of the doped regions having the largest depth is disposed between two adjacent doped regions.

7. The semiconductor device according to claim 1, wherein depths of the doped regions from a surface of the substrate are set such that one of the doped regions having the least depth is disposed between two adjacent doped regions.

8. The semiconductor device according to claim 1, further comprising:
   a body region of the first conductivity type disposed under the source region;
   an insulating layer disposed above the well region, the insulating layer connected to the drain region and spaced apart from the source region;
   a gate insulating layer connected to the insulating layer and extended to cover a portion of the body region; and
   a gate disposed on the insulating layer and the gate insulating layer.

9. The semiconductor device according to claim 1, wherein:
   the well region is doped with a first doping concentration, the lower portion is doped with a second doping concentration, and the upper portion is doped with a third doping concentration; and
   each of the second doping concentration and third doping concentration is higher than the first doping concentration.

10. The semiconductor device according to claim 1, wherein:
    the well region is doped with a first doping concentration, the lower portion is doped with a second doping concentration, and the upper portion is doped with a third doping concentration; and
    the second doping concentration is higher than the first doping concentration, and the third doping concentration is lower than the first doping concentration.

11. The semiconductor device according to claim 9, wherein the first doping concentration is about 1e11 to 1e13 atoms/cm$^2$.

12. The semiconductor device according to claim 10, wherein the first doping concentration is about 1e11 to 1e13 atoms/cm$^2$.

13. The semiconductor device according to claim 1, wherein the first conductivity type is p-type and the second conductivity type is n-type.

14. The semiconductor device according to claim 1, wherein the first conductivity type is n-type and the second conductivity type is p-type.

15. A semiconductor device comprising:
    a substrate having a first conductivity type;
    a plurality of epitaxial layers having the first conductivity type and disposed on the substrate;
    a drain region and a source region disposed in the uppermost epitaxial layer;
    a well region interposed between the drain region and the source region, the well region being disposed in the substrate and the epitaxial layers, the well region having a second conductivity type opposite to the first conductivity type; and
    a plurality of doped regions disposed in the epitaxial layers, at least two of the doped regions being vertically and horizontally offset from each other;

each of the doped regions comprising a lower portion having the first conductivity type, and an upper portion stacked on the lower region and having the second conductivity type.

16. The semiconductor device according to claim 15, wherein:
each of the epitaxial layers includes a doped region, and
the doped regions are vertically and horizontally offset from each other.

17. The semiconductor device according to claim 15, wherein:
at least one of the epitaxial layers includes a plurality of doped regions; and
the doped regions of the at least one of the epitaxial layers are horizontally separated from each other and disposed at a substantially same vertical level in the at least one of the epitaxial layers.

18. The semiconductor device according to claim 15, wherein depths of the doped regions from a surface of the substrate are set in an ascending or descending order in a direction from the source region to the drain region.

19. The semiconductor device according to claim 15, wherein depths of the doped regions from a surface of the substrate are set such that one of the doped regions having the largest depth is disposed between two adjacent doped regions.

20. The semiconductor device according to claim 15, wherein depths of the doped regions from a surface of the substrate are set such that one of the doped regions having the least depth is disposed between two adjacent doped regions.

21. The semiconductor device according to claim 15, further comprising:
a body region of the first conductivity type disposed under the source region;
an insulating layer disposed above the well region, the insulating layer connected to the drain region and spaced apart from the source region;
a gate insulating layer connected to the insulating layer and extended to cover a portion of the body region; and
a gate disposed on the insulating layer and the gate insulating layer.

22. The semiconductor device according to claim 15, wherein:
the well region is doped with a first doping concentration, the lower portion is doped with a second doping concentration, and the upper portion is doped with a third doping concentration; and
each of the second doping concentration and third doping concentration is higher than the first doping concentration.

23. The semiconductor device according to claim 15, wherein:
the well region is doped with a first doping concentration, the lower portion is doped with a second doping concentration, and the upper portion is doped with a third doping concentration; and
the second doping concentration is higher than the first doping concentration, and the third doping concentration is lower than the first doping concentration.

24. The semiconductor device according to claim 22, wherein the first doping concentration is about 1e11 to 1e13 atoms/cm$^2$.

25. The semiconductor device according to claim 23, wherein the first doping concentration is about 1e11 to 1e13 atoms/cm$^2$.

26. The semiconductor device according to claim 15, wherein the first conductivity type is p-type and the second conductivity type is n-type.

27. The semiconductor device according to claim 15, wherein the first conductivity type is n-type and the second conductivity type is p-type.

* * * * *